US011188414B2

(12) United States Patent
Takagiwa

(10) Patent No.: US 11,188,414 B2
(45) Date of Patent: *Nov. 30, 2021

(54) MEMORY SYSTEM

(71) Applicant: KIOXIA CORPORATION, Tokyo (JP)

(72) Inventor: Teruo Takagiwa, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/692,318

(22) Filed: Nov. 22, 2019

(65) Prior Publication Data
US 2020/0089565 A1    Mar. 19, 2020

Related U.S. Application Data

(63) Continuation of application No. 16/115,520, filed on Aug. 28, 2018, now Pat. No. 10,503,585.

(30) Foreign Application Priority Data

Mar. 22, 2018  (JP) .............................. JP2018-054534

(51) Int. Cl.
*G11C 11/10* (2006.01)
*G11C 7/06* (2006.01)
(Continued)

(52) U.S. Cl.
CPC ............ *G06F 11/1012* (2013.01); *G11C 7/06* (2013.01); *G11C 7/106* (2013.01); *G11C 7/109* (2013.01);
(Continued)

(58) Field of Classification Search
CPC ..... G06F 11/1012; G11C 16/26; G11C 16/08; G11C 16/10; G11C 16/24; G11C 7/1087; G11C 7/06; G11C 7/109; G11C 7/1063; G11C 7/106; G11C 16/3404; G11C 29/42; G11C 2029/1202; G11C 29/025; G11C 11/5642; G11C 16/0483; H01L 27/11548;
(Continued)

(56) References Cited

U.S. PATENT DOCUMENTS 8,009,472 B2   8/2011 Murin et al.
9,117,536 B2   8/2015 Yoon et al.
(Continued)

*Primary Examiner* — Tri M Hoang
(74) *Attorney, Agent, or Firm* — Kim & Stewart LLP

(57) ABSTRACT

A memory system includes a semiconductor memory and a memory controller. The semiconductor memory includes first memory cells, first bit lines connected to the first memory cells, second memory cells, second bit lines connected to the second memory cells, a word line connected to the first and second memory cells, and a driver configured to apply a voltage to the word line. In response to a special read command from the memory controller, the driver sequentially applies, to the word line, first read voltages to read data from the first memory cells, a second read voltage within a voltage range of the first read voltages to read data from the first memory cells, third read voltages to read data from the second memory cells, and a fourth read voltage within a voltage range of the third read voltages to read data from the second memory cells.

20 Claims, 25 Drawing Sheets

(51) Int. Cl.
    *G11C 7/10*           (2006.01)
    *G11C 16/34*         (2006.01)
    *G11C 16/08*         (2006.01)
    *G11C 16/10*         (2006.01)
    *G06F 11/10*         (2006.01)
    *G11C 16/26*         (2006.01)
    *G11C 16/24*         (2006.01)

(52) U.S. Cl.
    CPC .......... *G11C 7/1063* (2013.01); *G11C 7/1087* (2013.01); *G11C 16/08* (2013.01); *G11C 16/10* (2013.01); *G11C 16/24* (2013.01); *G11C 16/26* (2013.01); *G11C 16/3404* (2013.01)

(58) Field of Classification Search
    CPC ......... H01L 27/11575; H01L 27/11556; H01L 27/11582; H01L 27/11565; H01L 27/11519
    See application file for complete search history.

(56) References Cited

U.S. PATENT DOCUMENTS

| | | |
|---|---|---|
| 9,412,471 B2 | 8/2016 | Kim et al. |
| 9,543,031 B2 | 1/2017 | Kim |
| 10,503,585 B2 * | 12/2019 | Takagiwa .......... H01L 27/11575 |
| 2014/0043903 A1 | 2/2014 | Ok et al. |
| 2015/0269992 A1 | 9/2015 | Hara et al. |
| 2017/0186484 A1 | 6/2017 | Takada et al. |
| 2018/0059936 A1 | 3/2018 | Harada |

\* cited by examiner

FIG. 29
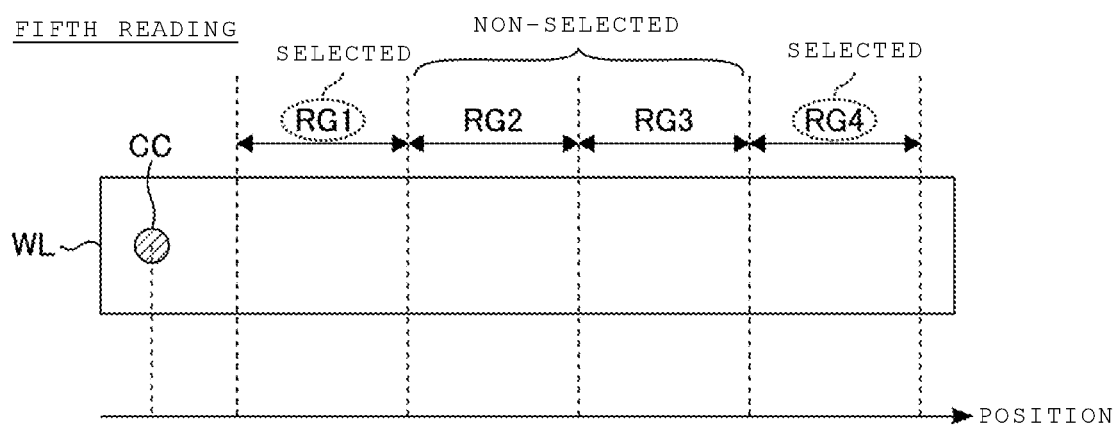
FIG. 30
SETTING CHANGING OPERATION

US 11,188,414 B2

MEMORY SYSTEM

CROSS-REFERENCE TO RELATED APPLICATIONS

This application is a continuation of U.S. patent application Ser. No. 16/115,520, filed Aug. 28, 2018, now U.S. Pat. No. 10,503,585, issued Dec. 10, 2019, which application is based upon and claims the benefit of priority from Japanese Patent Application No. 2018-054534, filed Mar. 22, 2018, the entire contents of which are incorporated herein by reference.

FIELD

Embodiments described herein relate generally to a memory system.

BACKGROUND

NAND flash memory can store data in a nonvolatile manner.

DESCRIPTION OF THE DRAWINGS

FIG. 29 is a schematic diagram illustrating an example of a region selection method during reading in the memory system according to the sixth embodiment.

FIG. 30 is a timing chart illustrating examples of commands and signals in a setting changing operation of the memory system according to a modification example of the first embodiment.

DETAILED DESCRIPTION

Figure 1:
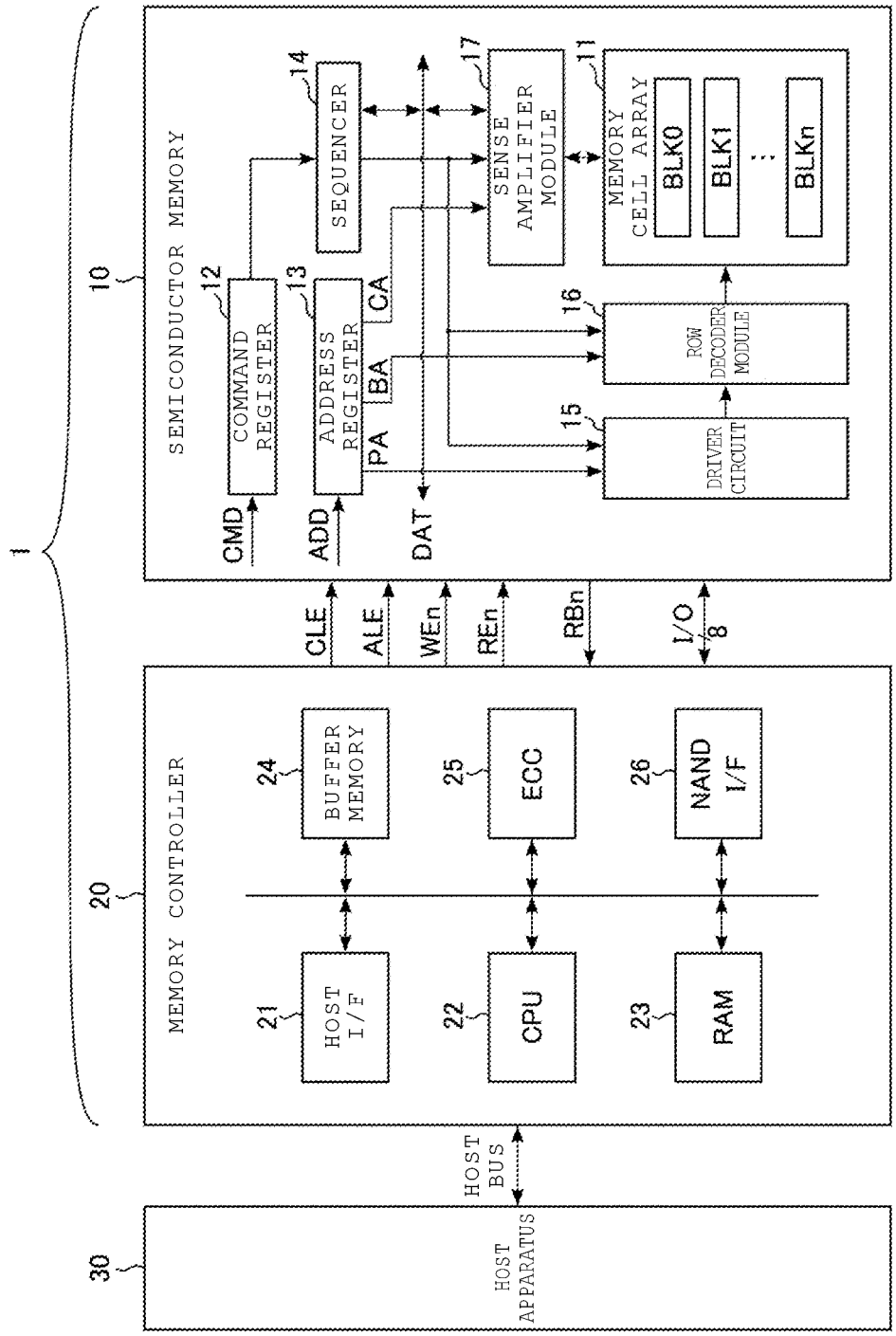
FIG. 1 is a block diagram illustrating a configuration example of a memory system according to a first embodiment.

In the embodiments, the capability of reading data stored in a memory cell is improved, thereby salvaging data.

According to one embodiment, there is provided a memory system including a semiconductor memory and a memory controller configured to control the semiconductor memory. The semiconductor memory includes a plurality of first memory cells each storing data based on a threshold voltage, a plurality of first bit lines connected to the plurality of first memory cells, a plurality of second memory cells each storing data based on a threshold voltage, a plurality of second bit lines connected to the plurality of second memory cells, a word line connected to the plurality of first and second memory cells, and a driver configured to apply a voltage to the word line. In response to a command set including a first command for instructing a first operation to be performed and a second command for instructing a read operation to be performed, received from the memory controller, the driver sequentially applies, to the word line, a plurality of first read voltages to read data from the first memory cells, a second read voltage within a voltage range of the first read voltages to read data from the first memory cells, a plurality of third read voltages to read data from the second memory cells, and a fourth read voltage within a voltage range of the third read voltages to read data from the second memory cells.

Hereinafter, embodiments will be described with reference to the drawings. The drawings are schematic. Each embodiment provides an example of an apparatus or a method for embodying the technical spirit of the present disclosure. In the following description, an elements having the substantially same function and configuration are given the same reference numeral. Numbers after letters forming a reference sign are referred to by a reference sign including the same letters, and are used to differentiate elements having the same configuration from each other. In a case where elements indicated by reference signs including the same letters are not required to be differentiated from each other, the elements are referred to by reference signs including only the common letters.

1. First Embodiment

Hereinafter, a description will be made of a memory system 1 in a first embodiment.

1-1. Configuration 1-1-1. Overall Configuration of Memory System 1

FIG. 1 illustrates a configuration example of the memory system 1 according to the first embodiment. As illustrated in FIG. 1, the memory system 1 includes a semiconductor memory 10 and a memory controller 20.

Hereinafter, a detailed configuration of each of the semiconductor memory 10 and the memory controller 20 will be described in order.

Configuration of Semiconductor Memory 10

The semiconductor memory 10 is a NAND flash memory which can store data in a nonvolatile manner. As illustrated in FIG. 1, the semiconductor memory 10 includes, for example, a memory cell array 11, a command register 12, an address register 13, a sequencer 14, a driver circuit 15, a row decoder module 16, and a sense amplifier module 17.

The memory cell array 11 includes a plurality of blocks BLK0 to BLKn (where n is an integer of 1 or greater). The block BLK is a set of a plurality of nonvolatile memory cells, and is, for example, the data erasing unit. The memory cell array 11 is provided with a plurality of bit lines and a plurality of word lines, and each memory cell is associated with a single bit line and a single word line.

The command register 12 stores a command CMD which is received by the semiconductor memory 10 from the memory controller 20. The command CMD includes, for example, a command causing the sequencer 14 to perform a read operation or to perform a write operation.

The address register 13 stores address information ADD which is received by the semiconductor memory 10 from the memory controller 20. The address information ADD includes, for example, a block address BA, a page address PA, and a column address CA. The block address BA is used to select, for example, a block BLK including a memory cell which is a target of various operations. The page address PA is used to select, for example, a word line associated with a memory cell which is a target of various operations. Hereinafter, a word line WL which is selected will be referred to as a selected word line WLsel, and a word line which is not selected will be referred to as a non-selected word line. The column address CA is used to select, for example, a bit line which is a target of various operations.

The sequencer 14 controls the entire operation of the semiconductor memory 10 based on the command CMD stored in the command register 12. For example, the sequencer 14 controls the driver circuit 15, the row decoder module 16, and the sense amplifier module 17, to perform an operation of writing data DAT received from the memory controller 20 or an operation of reading the data DAT stored in the memory cell array 11.

The driver circuit 15 generates a desired voltage based on an instruction from the sequencer 14. For example, the driver circuit 15 applies a voltage to be applied to each of selected and non-selected word lines to a corresponding signal line in the memory cell array 11 based on the page address PA stored in the address register 13.

For example, the row decoder module 16 selects a single block BLK based on the block address BA stored in the address register 13. The row decoder module 16 applies voltages applied to respective signal lines by the driver circuit 15, to a selected word line and a non-selected word line.

The sense amplifier module 17 applies a desired voltage to each bit line according to the data DAT received from the memory controller 20. The sense amplifier module 17 determines data stored in a memory cell based on a voltage of a bit line, and transmits the determined read data DAT to the memory controller 20.

Configuration of Memory Controller 20

The memory controller 20 instructs the semiconductor memory 10 to perform reading, writing, and erasing in response to commands from a host apparatus 30. As illustrated in FIG. 1, the memory controller 20 includes a host interface circuit 21, a central processing unit (CPU) 22, a random access memory (RAM) 23, a buffer memory 24, an error correction code (ECC) circuit 25, and a NAND interface circuit 26.

The host interface circuit 21 is connected to the external host apparatus 30 via a host bus, and controls transmission of data, commands, and addresses between the memory controller 20 and the host apparatus 30. The host interface circuit 21 supports communication interface standards such as Serial Advanced Technology Attachment (SATA), Serial Attached SCSI (SAS), and PCI Express (PCIe).

The CPU 22 controls the entire operation of the memory controller 20. For example, the CPU 22 issues a write command in response to a write command received from the host apparatus 30. The CPU 22 performs various processes for managing a memory space of the semiconductor memory 10, such as wear-leveling.

The RAM 23 is a volatile memory such as a dynamic random access memory (DRAM). The RAM 23 is used as a work area of the CPU 22. For example, the RAM 23 stores firmware and various management tables for managing the semiconductor memory 10.

The buffer memory 24 temporarily stores read data received from the semiconductor memory 10 by the memory controller 20 or write data received from the host apparatus 30.

The ECC circuit 25 performs data error correction processes. Specifically, during a write operation, the ECC circuit 25 generates a parity based on write data received from the host apparatus 30, and assigns the generated parity to the write data. During a read operation, the ECC circuit 25 generates a syndrome based on read data received from the semiconductor memory 10, and detects and corrects an error of the read data based on the generated syndrome.

The NAND interface circuit 26 controls transmission of data, commands, and addresses between the memory controller 20 and the semiconductor memory 10, and supports a NAND interface standard. For example, the NAND interface circuit 26 transmits a command latch enable signal CLE, an address latch enable signal ALE, a write enable signal WEn, and a read enable signal REn, receives a ready/busy signal RBn, and transmits and receives an input/output signal I/O.

The command latch enable signal CLE is a signal for notifying the semiconductor memory 10 that the received input signal I/O is the command CMD. The address latch enable signal ALE is a signal for notifying the semiconductor memory 10 that the received input signal I/O is the address information ADD.

The write enable signal WEn is a signal for instructing the semiconductor memory 10 to input the input/output signal I/O. The read enable signal REn is a signal for instructing the semiconductor memory 10 to output the input/output signal I/O.

The ready/busy signal RBn is a signal for notifying the memory controller 20 of a ready state in which the semiconductor memory 10 is able to receive a command from the memory controller 20 or a busy state in which the semiconductor memory 10 is unable to receive a command from the memory controller 20. The input/output signal I/O is, for example, an 8-bit width signal, and may include the command CMD, the address information ADD, the write data DAT, and the read data DAT.

The semiconductor memory 10 and the memory controller 20 described above may configure a single semiconductor device through a combination thereof. Such a semiconductor device may include, for example, a memory card such as an SD™ card, and a solid state drive (SSD).

1-1-2. Configuration of Memory Cell Array 11 (Circuit Configuration of Memory Cell Array 11)

Figure 2:
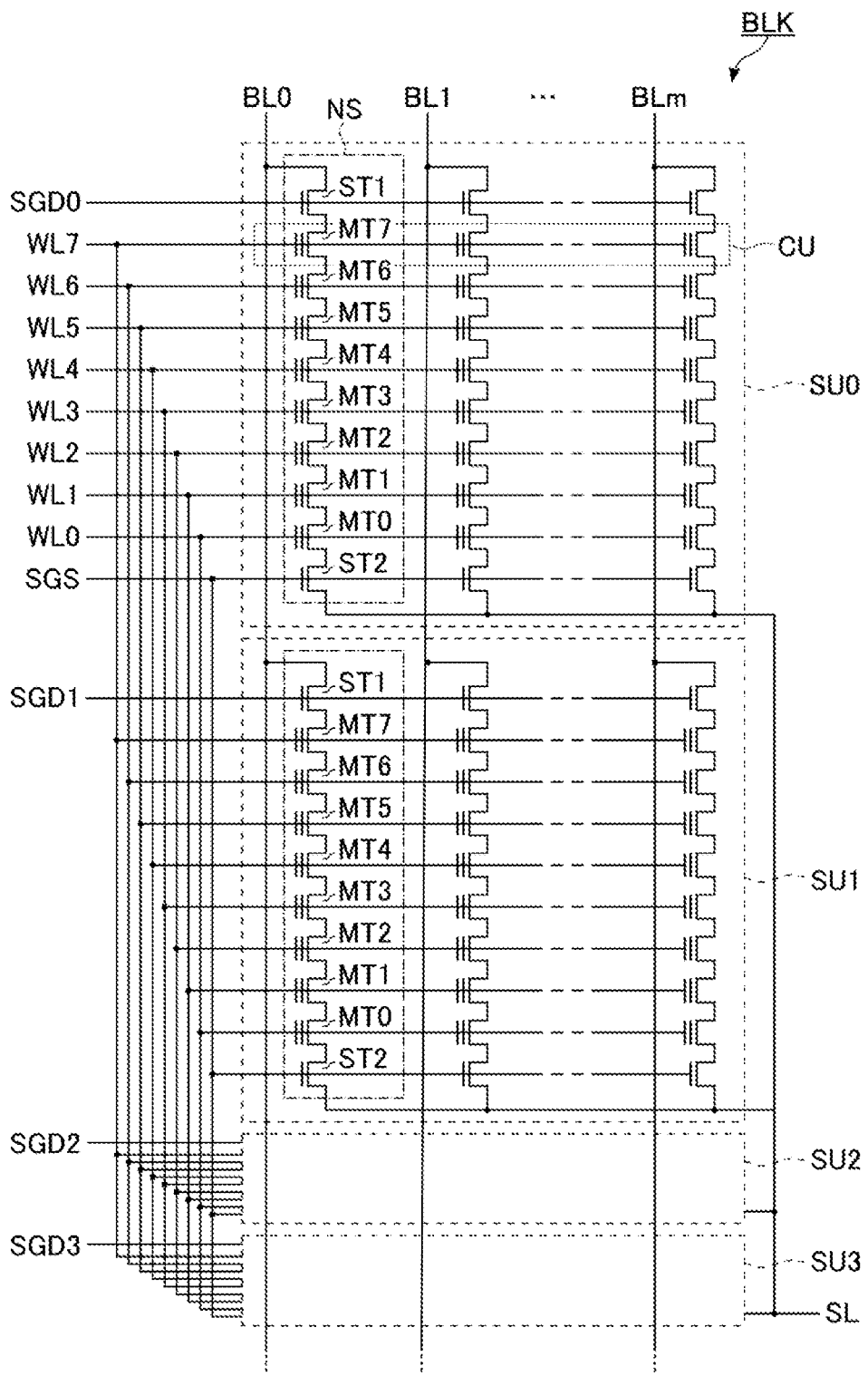
FIG. 2 is a circuit diagram illustrating an example of a circuit configuration of a memory cell array in a semiconductor memory in the first embodiment.

FIG. 2 illustrates an example of a circuit configuration of the memory cell array 11 in the semiconductor memory 10 of the first embodiment. Hereinafter, a circuit configuration of the memory cell array 11 will be described focusing on a single block BLK.

As illustrated in FIG. 2, the block BLK includes, for example, four string units SU0 to SU3. Each string unit SU includes a plurality of NAND strings NS respectively associated with bit lines BL0 to BLm (where m is an integer of 1 or greater). Each of the NAND strings NS includes, for example, eight memory cell transistors MT0 to MT7, and select transistors ST1 and ST2.

The memory cell transistor MT includes a control gate and a charge storage layer, and stores data in a nonvolatile manner. The memory cell transistors MT0 to MT7 in each NAND string NS are connected in series between a source of the select transistor ST1 and a drain of the select transistor ST2. Control gates of the memory cell transistors MT0 to MT7 in the same block BLK are connected in common to word lines WL0 to WL7, respectively.

Each of the select transistors ST1 and ST2 is used to select the string unit SU during various operations. Gates of the select transistors ST1 respectively provided in the string units SU0 to SU3 in the same block BLK are connected in common to the select gate lines SGD0 to SGD3. The drains of the select transistors ST1 corresponding to the same column in each block BLK are connected in common to a corresponding bit line BL. Gates of the select transistors ST2 in the same block BLK are connected in common to a select gate line SGS. The sources of the select transistors ST2 in each block BLK are connected in common to a source line SL across a plurality of blocks BLK.

In the following description, a plurality of memory cell transistors MT connected to a common word line WL in a single string unit SU will be referred to as a cell unit CU. In the cell unit CU, the capacity of stored data changes depending on the number of bits of data stored in the memory cell transistors MT included in the cell unit CU.

For example, in a case where each memory cell transistor MT stores 1-bit data, a single cell unit CU can store 1-page data, and, in a case where each memory cell transistor MT stores 2-bit data, a single cell unit CU can store 2-page data. In other words, the "1-page data" is defined as a total amount of data stored by the cell unit CU, for example, in a case where each of the memory cell transistors MT included in the single cell unit CU stores 1-bit data.

Threshold Voltage Distribution and Data Allocation in Memory Cell Transistor MT

Figure 3:
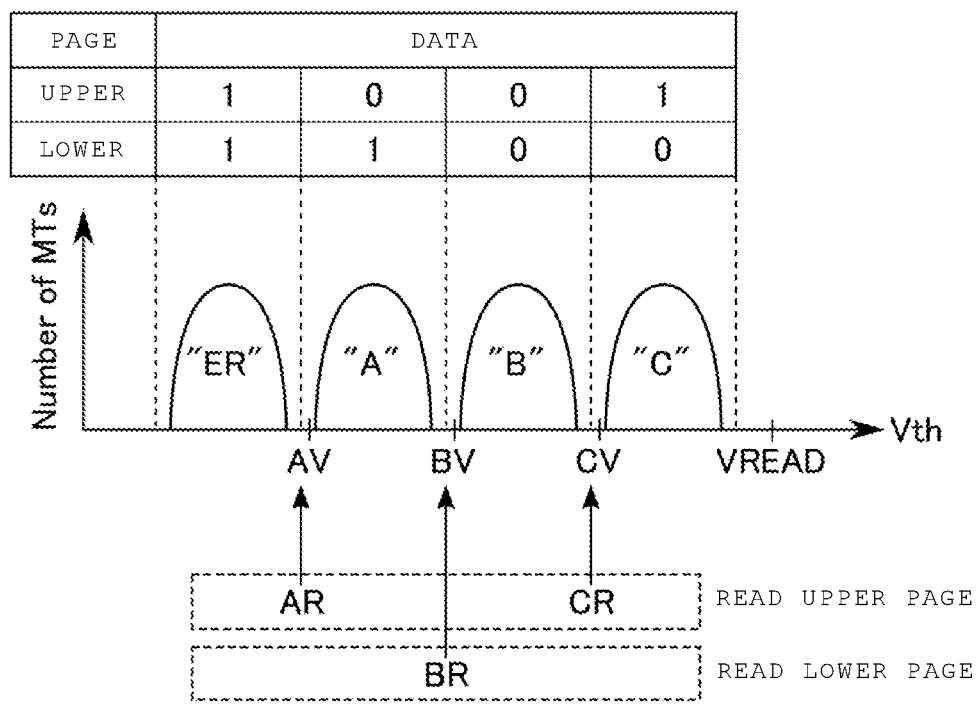
FIG. 3 is a threshold voltage distribution diagram illustrating an example of a distribution of a threshold voltage of a memory cell transistor in the first embodiment.

FIG. 3 illustrates examples of a threshold voltage distribution, data allocation, a read voltage, and a verification voltage in the memory cell transistor MT in a case where a single cell unit CU stores 2-page data, that is, each memory cell transistor MT stores 2-bit data. A longitudinal axis of a graph illustrated in FIG. 3 corresponds to the number of memory cell transistors MT, and a transverse axis corresponds to a threshold voltage Vth of the memory cell transistor MT.

In a case where each memory cell transistor MT stores 2-bit data, as illustrated in FIG. 3, a threshold voltage distribution in the memory cell transistor MT is classified into four distributions. Such threshold voltage distributions are referred to as, for example, an "ER" level, an "A" level, a "B" level, and a "C" level in an ascending order of a threshold voltage. For example, 2-bit data described below may be allocated to each of the threshold voltage distributions.

"ER" level: data of "11 (upper bit/lower bit)"
"A" level: data of "01"
"B" level: data of "00"
"C" level: data of "10"

A read voltage used for a read operation is set between threshold voltage distributions adjacent to each other. Specifically, a read voltage AR is set between the "ER" level and the "A" level, a read voltage BR is set between the "A" level and the "B" level, and a read voltage CR is set between the "B" level and the "C" level.

More specifically, the read voltage AR is set between the maximum threshold voltage in the "ER" level and the minimum threshold voltage in the "A" level. In a case where the read voltage AR is applied to the gate of the memory cell transistor MT, if a threshold voltage thereof is distributed in the "ER" level, the memory cell transistor MT is turned on, and, if a threshold voltage thereof is distributed in the "A" level or higher, the memory cell transistor MT is turned off.

The read voltage BR is set between the maximum threshold voltage in the "A" level and the minimum threshold voltage in the "B" level. In a case where the read voltage BR is applied to the gate of the memory cell transistor MT, if a threshold voltage thereof is distributed in the "A" level or lower, the memory cell transistor MT is turned on, and, if a threshold voltage thereof is distributed in the "B" level or higher, the memory cell transistor MT is turned off.

The read voltage CR is set between the maximum threshold voltage in the "B" level and the minimum threshold voltage in the "C" level. In a case where the read voltage BR is applied to the gate of the memory cell transistor MT, if a threshold voltage thereof is distributed in the "B" level or lower, the memory cell transistor MT is turned on, and, if a threshold voltage thereof is distributed in the "C" level, the memory cell transistor MT is turned off.

A voltage higher than the highest threshold voltage distribution is set as a read pass voltage VREAD. Specifically, the read pass voltage VREAD is set to a voltage higher than the maximum threshold voltage in the "C" level. In a case where the read pass voltage VREAD is applied to the gate of the memory cell transistor MT, the memory cell transistor MT is turned on regardless of stored data.

A verification voltage used for a write operation is set between threshold voltage distributions adjacent to each other. Specifically, verification voltages AV, BV, and CV are set to correspond to the "A" level, the "B" level, and the "C" level.

Specifically, the verification voltage AV is set between the maximum threshold voltage in the "ER" level and the minimum threshold voltage in the "A" level, and near the "A" level. The verification voltage BV is set between the maximum threshold voltage in the "A" level and the minimum threshold voltage in the "B" level, and near the "B" level. The verification voltage CV is set between the maximum threshold voltage in the "B" level and the minimum threshold voltage in the "C" level, and near the "C" level. In other words, for example, the verification voltages AV, BV, and CV are respectively set to be higher than the read voltages AR, BR, and CR.

In a write operation, if the semiconductor memory 10 detects that a threshold voltage of the memory cell transistor MT in which certain data is stored exceeds a verification voltage corresponding to the data, programming of the memory cell transistor MT is completed.

In a case where the above-described data allocation is applied, 1-page data (lower page data) having lower bits is determined based on a read result using the read voltage BR. 1-page data (upper page data) having upper bits is determined based on read results using the respective read voltages and AR and CR.

As mentioned above, lower page data and upper page data are respectively determined through one read operation and two read operations, and thus the data allocation illustrated in FIG. 3 is referred to as a "1-2 code". In the first embodiment, as an example, a description will be made of a case where the "1-2 code" is applied to allocation of data to the memory cell transistor MT.

Structure of Memory Cell Array 11

Figure 4:
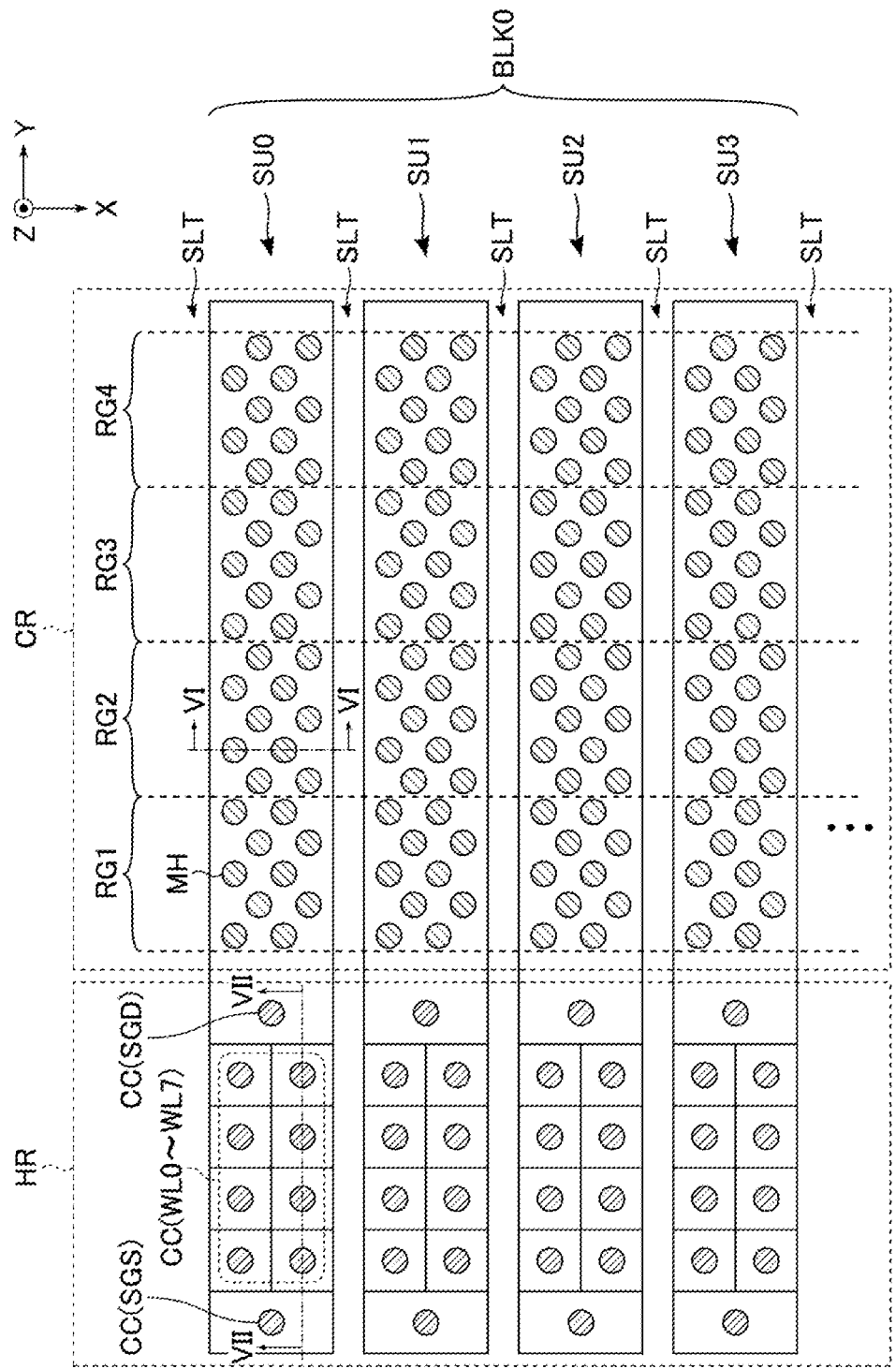
FIG. 4 is a plan view illustrating an example of a planar layout of the memory cell array in the first embodiment.

FIG. 4 illustrates an example of a planar layout of the memory cell array 11 in the first embodiment. In the drawings used for the following description, an X axis corresponds to an extending direction of the bit line BL, a Y axis corresponds to an extending direction of the word line WL, and a Z axis corresponds to a vertical direction to a surface of a semiconductor substrate.

For example, in the block BLK0, as illustrated in FIG. 4, structural bodies respectively corresponding to the string units SU0 to SU3 are provided to extend in the Y direction, and are arranged along the X direction. Similarly, for example, structural bodies corresponding to the string units SU of other blocks BLK are also provided to extend in the Y direction, and are arranged along the X direction, in regions (not illustrated).

For example, a slit SLT is provided between the string units SU adjacent to each other. In other words, for example, a plurality of slits SLT extend in the Y direction, and are arranged along the X direction. In this example, a single string unit SU is provided between the slits SLT adjacent to each other, but a plurality of string units SU may be provided between the slits SLT adjacent to each other.

Each of the structural bodies corresponding to the string units SU includes, for example, a cell region CR and a hookup region HR.

First, the cell region CR will be described in detail. The cell region CR is a region for storing data. A plurality of memory pillars MH are provided, for example, in a zigzag form in the cell region CR. Each of the memory pillars MH is provided for a single NAND string NS.

The cell region CR includes four regions RG1 to RG4 which are separated in the Y direction. Each of the regions RG1 to RG4 is used as the operation unit in a read operation which will be described later, and includes a plurality of memory pillars MH. In the memory system 1 according to the first embodiment, the number or an arrangement method of the regions RG included in the cell region CR is not limited thereto, and the cell region CR may be divided into regions RG of any number. The memory pillars MH illustrated in FIG. 4 are schematic, and the number of memory pillars MH is not limited to the illustrated number.

Figure 5:
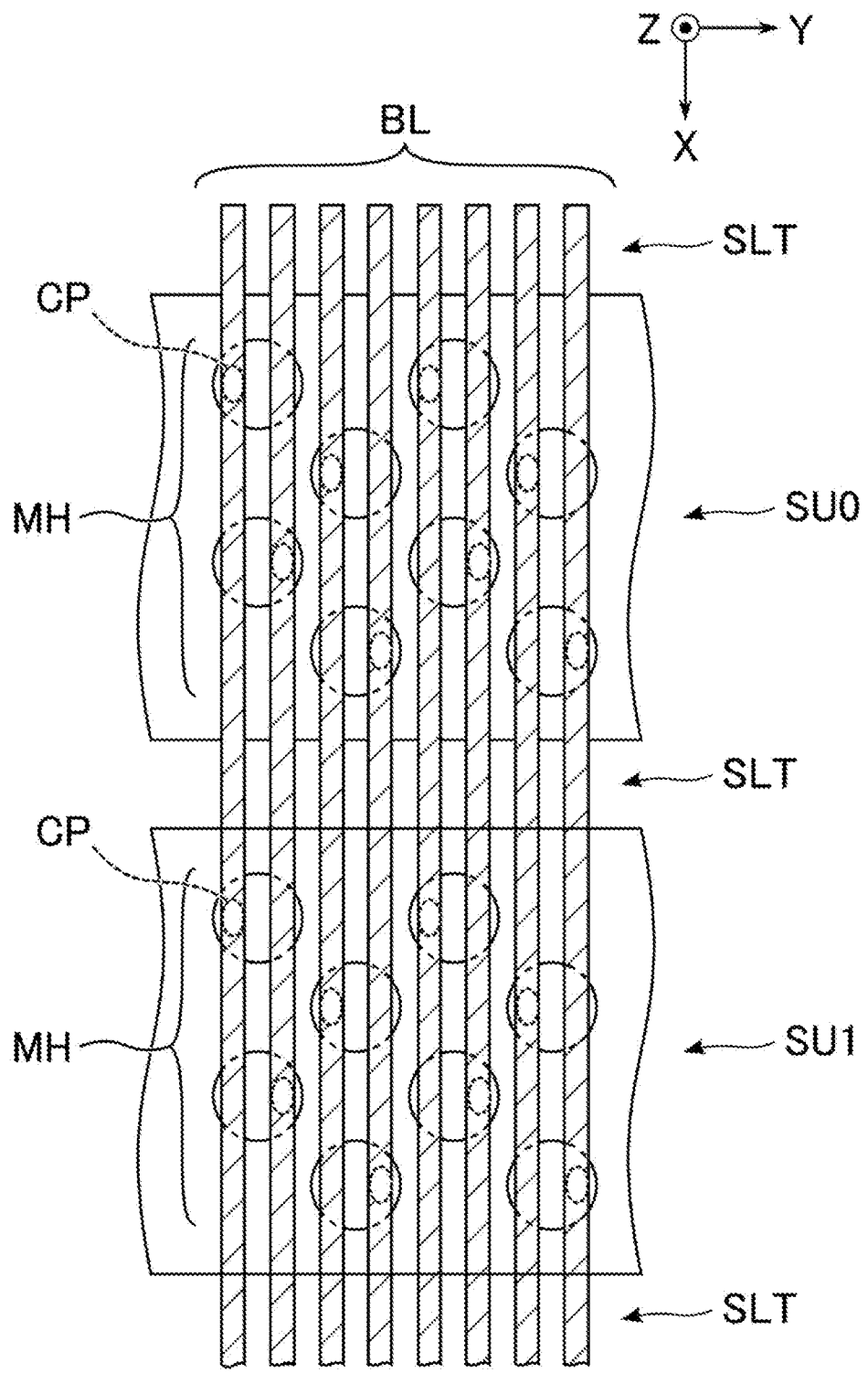
FIG. 5 is a plan view illustrating an example of a detailed planar layout of a cell region of the memory cell array in the first embodiment.

FIG. 5 illustrates an example of a detailed planar layout of the cell region CR of the memory cell array 11 in the first embodiment. As illustrated in FIG. 5, each of a plurality of bit lines BL arranged along the Y direction is connected to a single memory pillar MH for each string unit.

Specifically, in each string unit SU, each memory pillar MH is provided to overlap, for example, two bit lines BL. Of the two overlapping bit lines BL, one bit line BL is connected to the corresponding memory pillar MH via a contact plug CP.

Figure 6:
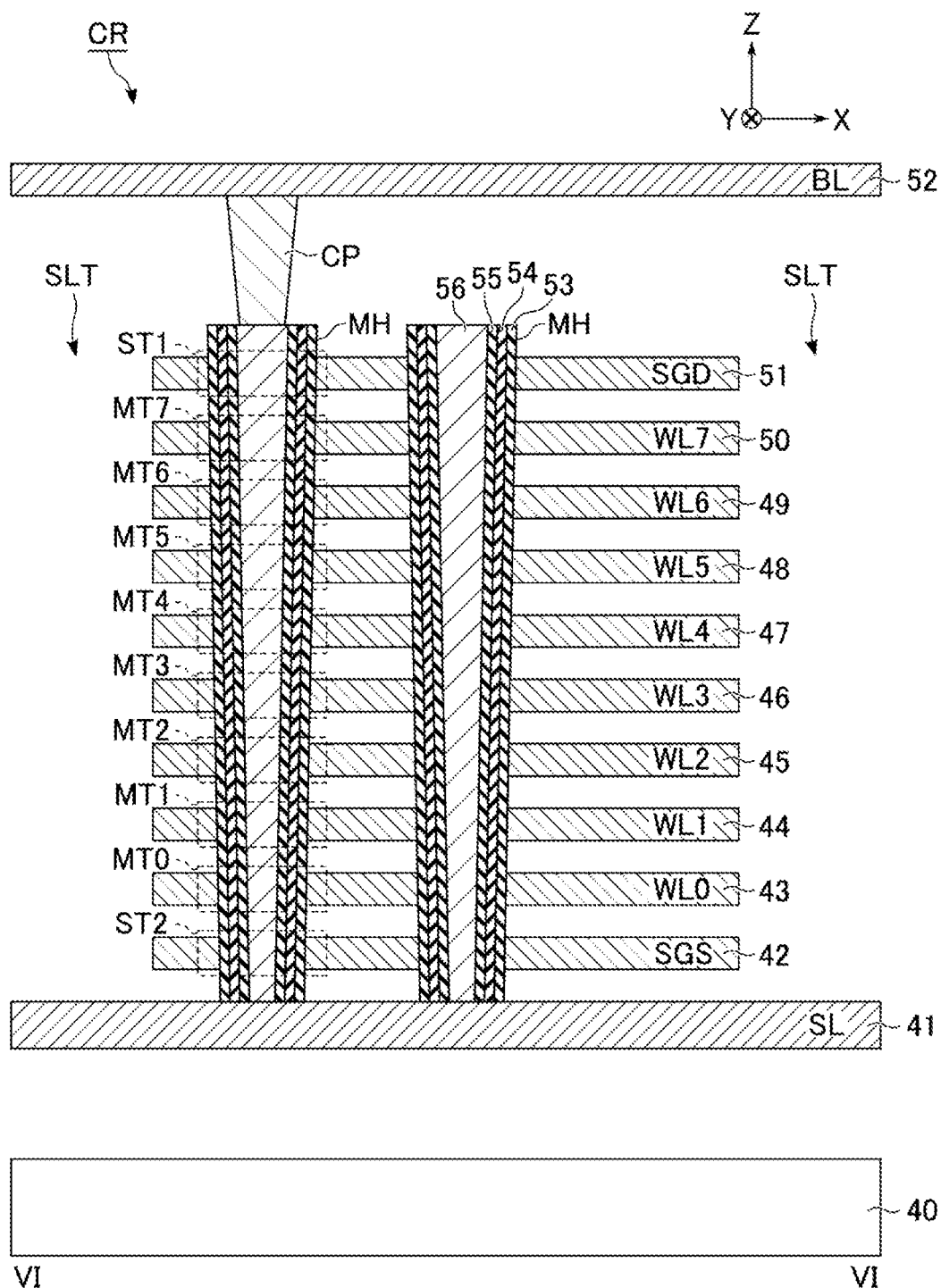
FIG. 6 is a sectional view illustrating an example of a sectional structure of the cell region of the memory cell array in the first embodiment.

FIG. 6 illustrates an example of a sectional structure of the memory cell array 11 along the line VI-VI in FIG. 4. In sectional views used for the following description, an interlayer insulating film may be omitted.

In the cell region CR, as illustrated in FIG. 6, the memory cell array 11 includes, for example, a semiconductor substrate 40, conductors 41 to 52, the memory pillars MH, and the contact plug CP.

The conductor 41 is provided on the semiconductor substrate 40 via an interlayer insulating film (not illustrated). The conductor 41 is formed in a tabular shape which is parallel to an XY plane, and corresponds to, for example, the source line SL.

The conductors 42 to 51 are provided on the conductor 41 in order from the semiconductor substrate 40 side, for each of the respective string units SU. Among the conductors, the conductors adjacent to each other in the Z direction are stacked via an interlayer insulating film (not illustrated). Each of the conductors 42 to 51 is formed in a tabular shape which is parallel to the XY plane. For example, the conductor 42 corresponds to the select gate line SGS, and the conductors 33 to 40 respectively correspond to the word lines WL0 to WL7, and the conductor 41 corresponds to the select gate line SGD.

A plurality of slits SLT which are provided to be parallel to a YZ plane are arranged along the X direction in order to separate the string units SU from each other. Each slit SLT reaches an upper part of the conductor 41 from at least the conductor 51. For example, a structural body between the slits SLT adjacent to each other over the conductor 41 corresponds to a single string unit SU.

Each memory pillar MH is provided in a columnar shape which passes through (penetrates) the respective conductors 42 to 51, and is in contact with the conductor 41. The memory pillar MH includes, for example, a block insulating film 53, an insulating film 54, a tunnel oxide film 55, and a semiconductor material 56.

The block insulating film 53 is provided on an inner wall of a memory hole formed in a manufacturing process of the semiconductor memory 10. The insulating film 54 is provided on an inner wall of the block insulating film 53. The insulating film 54 functions as a charge storage layer of the memory cell transistor MT. The tunnel oxide film 55 is provided on an inner wall of the insulating film 54. The semiconductor material 56 is provided on an inner wall of the tunnel oxide film 55. The semiconductor material 56 is conductive, and functions as a current path of the NAND string NS. A different material may be further provided on an inner wall of the semiconductor material 56.

A portion where the above-described memory pillar MH and the conductor 42 intersect each other functions as the select transistor ST2. Portions where the memory pillar MH and the respective conductors 43 to 50 intersect each other function as the memory cell transistors MT0 to MT7, respectively. A portion where the memory pillar MH and the conductor 51 intersect each other functions as the select transistor ST1.

The conductor 52 is provided over a surface of the memory pillar MH via an interlayer insulating film. The conductor extends in the X direction, is linearly formed, and corresponds to the bit line BL. A plurality of conductors 52 are arranged along the Y direction (not illustrated). The conductor 52 is electrically connected to a single corresponding memory pillar MH for each string unit SU.

Specifically, in each string unit SU, for example, the conductive contact plug CP is provided on the semiconductor material 56 in the memory pillar MH, and a single conductor 52 is provided on the contact plug CP. This is only an example, and the memory pillar MH and the conductor 52 may be connected to each other via a plurality of contact plugs or an interconnection.

Referring to FIG. 4 again, the hookup region HR will be described in detail. The hookup region HR is a region for electrically connecting various interconnections connected to the memory cells and the like provided in the cell region CR to the row decoder module 16.

In the hookup region HR, a plurality of interconnection layers respectively corresponding to the select gate line SGS, the word lines WL0 to WL7, and the select gate line SGD have portions which do not have corresponding interconnection layers on upper layers thereof. For example, an end portion of an interconnection layer corresponding to the word line WL is provided in a two-row stepped shape.

In the hookup region HR, for example, contact plugs CC are provided to respectively correspond to the select gate line SGS, the word lines WL0 to WL7, and the select gate line SGD. Each of the select gate line SGS, the word lines WL0 to WL7, and the select gate line SGD is electrically connected to the row decoder module 16 via the corresponding contact plug CC.

Figure 7:
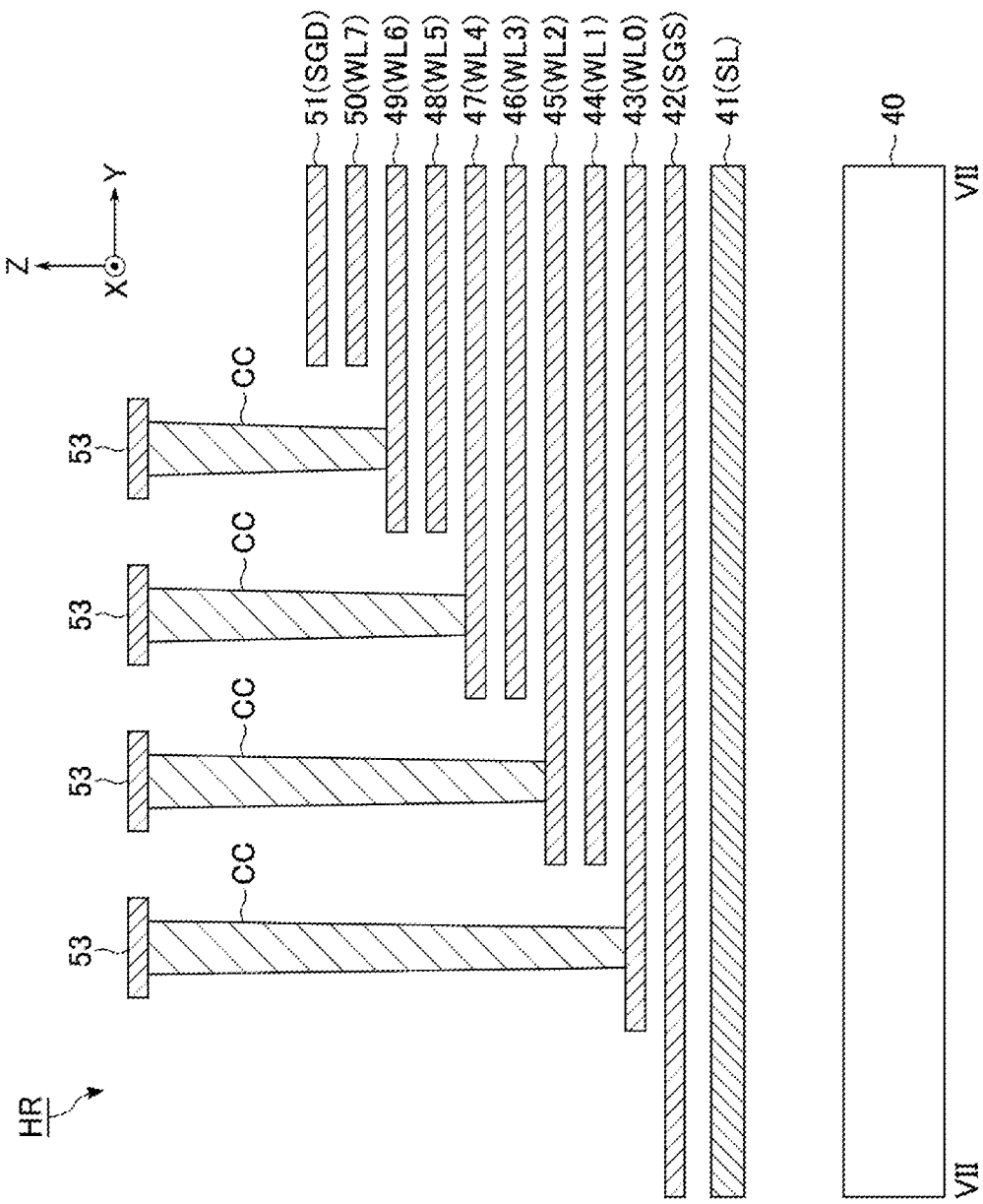
FIG. 7 is a sectional view illustrating an example of a sectional structure of a hookup region of the memory cell array in the first embodiment.

FIG. 7 illustrates an example of a sectional structure of the memory cell array 11 along the line VII-VII in FIG. 4. As illustrated in FIG. 7, the hookup region HR includes end portions of the conductors 41 to 51 provided in the cell region CR, a plurality of contact plugs CC, and a plurality of conductors 53.

The conductor 53 is a wire for connecting each wire drawn out to the hookup region HR from the cell region CR to the row decoder module 16. The plurality of conductors 53 are provided to respectively correspond to the conductors 42 to 51. In the region illustrated in FIG. 7, the contact plugs CC (WL0), CC (WL2), CC (WL4), and CC (WL6) are respectively provided at the end portions of the conductors 43, 45, 47, and 49. Although not illustrated in FIG. 7, the contact plugs CC (WL1), CC (WL3), CC (WL5), and CC (WL7) are also respectively provided at the end portions of the conductors 44, 46, 48, and 50 at positions which are different from those of the contact plugs CC (WL0), CC (WL2), CC (WL4), and CC (WL6) in the X direction. Although not illustrated in FIG. 7, the contact plugs CC (SGS) and CC (SGD) are provided at the end portions of the conductors 42 and 51. Each contact plug is connected to the corresponding conductor 53.

With this structure, the select gate line SGS, the word lines WL0 to WL7, and the select gate line SGD are electrically connected to the row decoder module 16 via the corresponding contact plugs CC and conductors 53.

The configuration of the memory cell array 11 is described above, but the memory cell array 11 is not limited to the above-described configuration. For example, the number of string units SU in each block BLK may be designed to be any number. Each of the memory cell transistors MT and the select transistors ST1 and ST2 in each NAND string NS may be designed to be any number.

The numbers of word lines WL and the select gate lines SGD and SGS are changed based on the numbers of the memory cell transistors MT and the select transistors ST1 and ST2. A plurality of conductors 42 respectively provided in a plurality of layers may be allocated to the select gate line SGS, and a plurality of conductors 51 respectively provided in a plurality of layers may be allocated to the select gate line SGD. A single NAND string NS may have a structure in which a plurality of memory pillars MH are connected to each other in the Z direction. The memory pillar MH and the conductor 52 may be connected to each other via a plurality of contact plugs CP or conductors.

1-1-3. Configuration of Row Decoder Module 16

Figure 8:
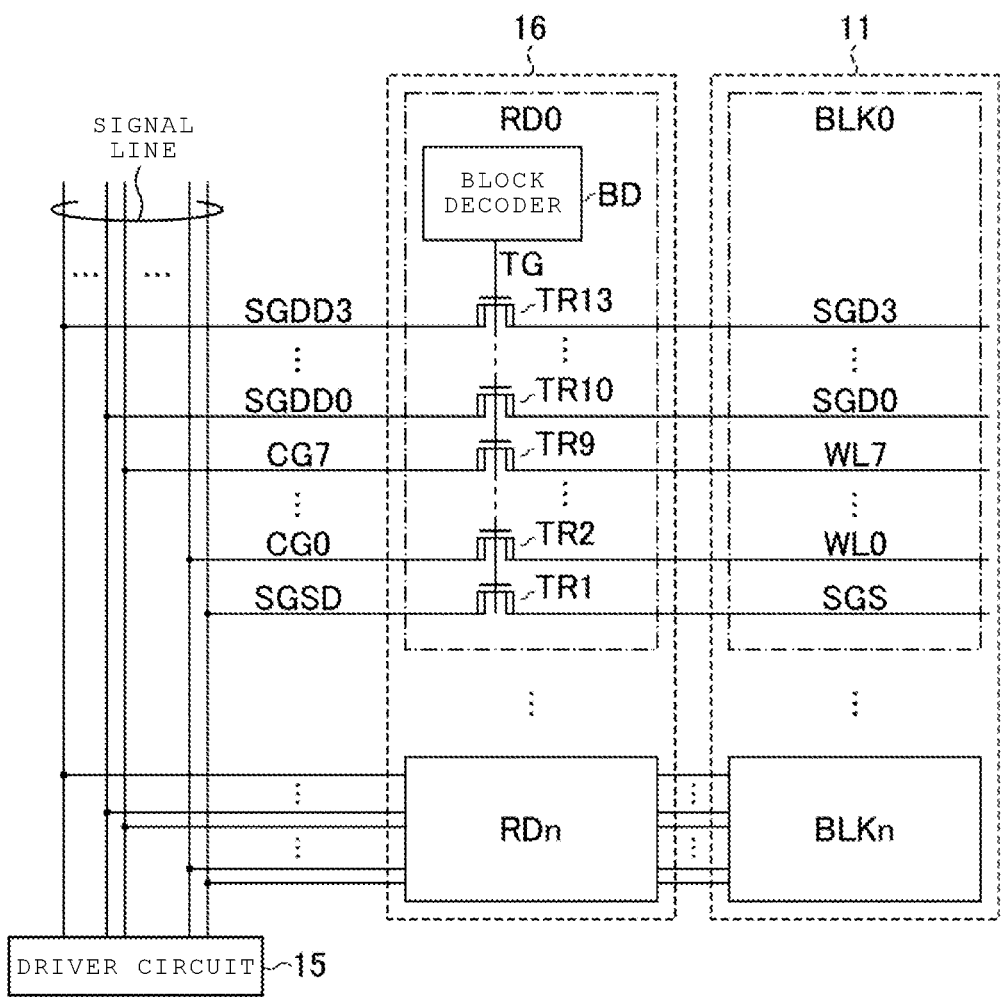
FIG. 8 is a circuit diagram illustrating an example of a circuit configuration of a row decoder module in the semiconductor memory in the first embodiment.

FIG. 8 illustrates an example of a circuit configuration of the row decoder module 16 provided in the semiconductor memory 10 in the first embodiment. As illustrated in FIG. 8, the row decoder module 16 includes row decoders RD0 to RDn.

The row decoders RD0 to RDn are respectively associated with the blocks BLK0 to BLKn. In other words, each block BLK is associated with a single row decoder RD. Hereinafter, a description will be made of a detailed circuit configuration of the row decoder RD focusing on the row decoder RD0 corresponding to the block BLK0.

The row decoder RD includes a block decoder BD and high breakdown voltage n-channel MOS transistors TR1 to TR13. The block decoder BD decodes the block address BA, and applies a predetermined voltage to a transmission gate TG based on a decoding result. The transmission gate TG is connected in common to gates of the transistors TR1 to TR13. The transistors TR1 to TR13 are connected between various signal lines extended from the driver circuit 15 and various interconnections of the associated block BLK.

Specifically, one end of the transistor TR1 is connected to a signal line SGSD, and the other end of the transistor TR1 is correspond to the select gate line SGS. One ends of the transistors TR2 to TR9 are respectively connected to signal lines CG0 to CG7, and the other ends of the transistors TR2 to TR9 are respectively connected to the word lines WL0 to WL7. One ends of the transistors TRIO to TR13 are respectively connected to signal lines SGDD0 to SGDD3, and the other ends of the transistors TRIO to TR13 are respectively connected to the select gate lines SGD0 to SGD3.

With this configuration, the row decoder module 16 can select the block BLK on which various operations are performed. Specifically, during various operations, the block decoders BD corresponding to selected and non-selected blocks BLK respectively apply voltages with an "H" level and an "L" level to the transmission gates TG.

For example, in a case where the block BLK0 is selected, the transistors TR1 to TR13 in the row decoder RD0 are turned on, and the transistors TR1 to TR13 in other row decoders RD are turned off. In other words, current paths are formed between various interconnections provided in the block BLK0 and corresponding signal lines, and current paths are interrupted between various interconnections provided in the other blocks BLK and corresponding signal lines. As a result, voltages applied to the respective signal lines by the driver circuit 15 are respectively applied to the various interconnections provided in the selected block BLK0 via the row decoder RD0.

1-1-4. Configuration of Sense Amplifier Module 17

Figure 9:
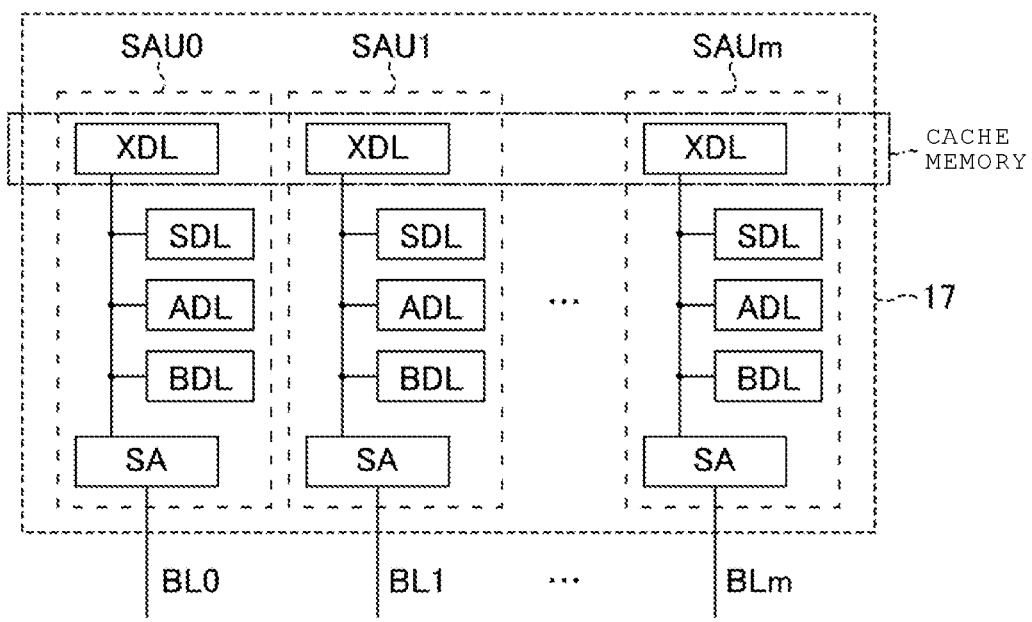
FIG. 9 is a circuit diagram illustrating an example of a circuit configuration of a sense amplifier module in the semiconductor memory in the first embodiment.

FIG. 9 illustrates an example of the sense amplifier module 17 in the first embodiment. As illustrated in FIG. 9, the sense amplifier module 17 includes, for example, sense amplifier units SAU0 to SAUm.

The sense amplifier units SAU0 to SAUm are respectively associated with the bit lines BL0 to BLm. Each sense amplifier unit SAU includes, for example, a sense amplifier portion SA, and latch circuits SDL, ADL, BDL, and XDL. The sense amplifier portion SA and the latch circuits SDL, ADL, BDL, and XDL are connected to each other so as to transmit and received data.

The sense amplifier portion SA senses data read onto the corresponding bit line BL, for example, in a read operation, and determines whether the read data "0" or "1". Each of the latch circuits SDL, ADL, BDL, and XDL temporarily stores read data or write data.

The latch circuit XDL is connected to an input/output circuit (not illustrated), and is used to input and output of data between the sense amplifier unit SAU and the input/output circuit. In other words, the latch circuit XDL functions as, for example, a cache memory of the semiconductor memory 10. For example, the semiconductor memory 10 can be brought into a ready state in a case where the latch circuit XDL is vacant even if the latch circuits SDL, ADL, and BDL are used.

Figure 10:
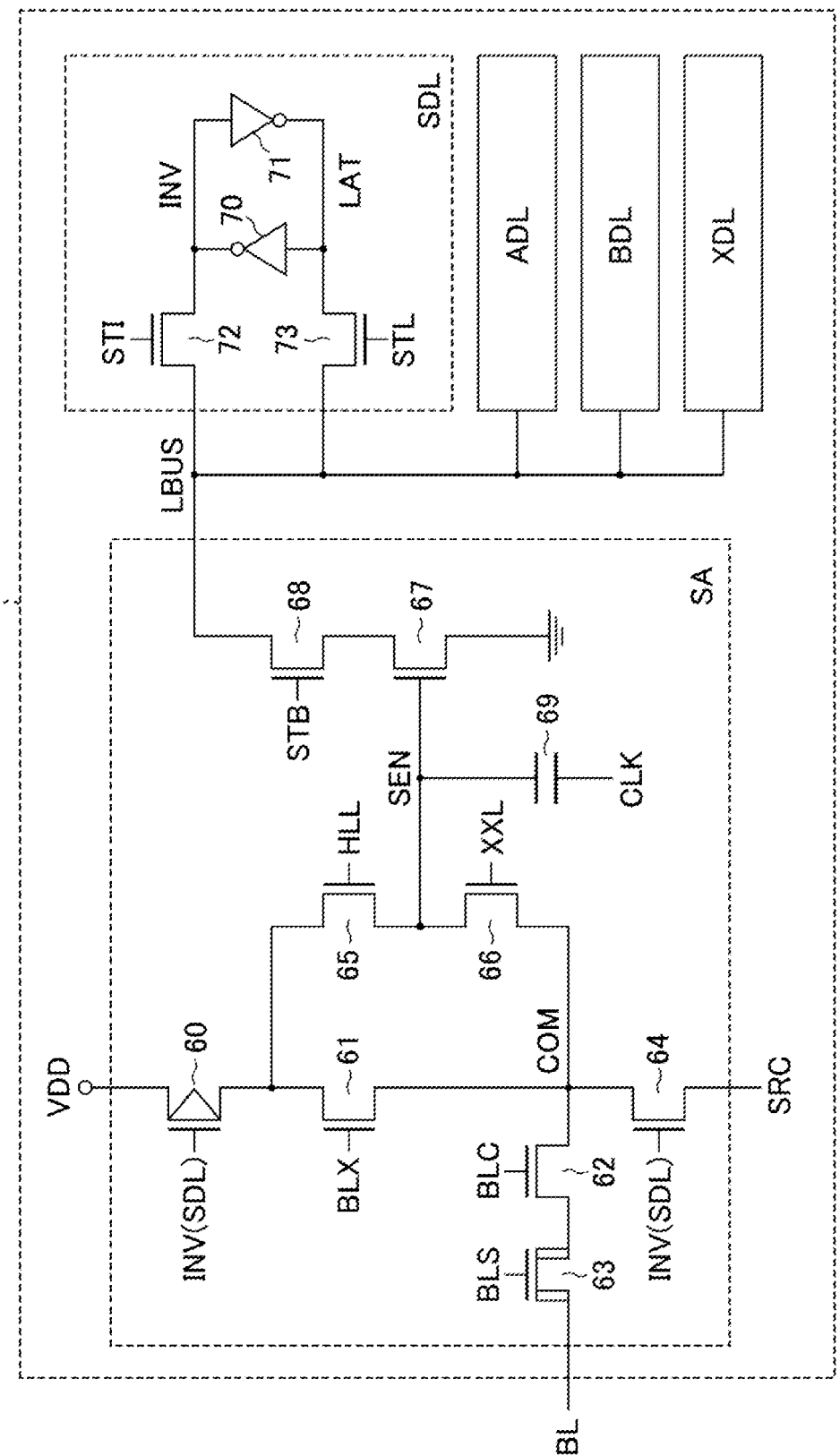
FIG. 10 is a circuit diagram illustrating an example of a circuit configuration of a sense amplifier unit in the sense amplifier module in the first embodiment.

FIG. 10 illustrates an extracted detailed circuit configuration of a single sense amplifier unit SAU. As illustrated in FIG. 10, the sense amplifier portion SA includes, for example, a p-channel MOS transistor 60, n-channel MOS transistors 61 to 68, and a capacitor 69. The latch circuit SDL includes, for example, inverters 70 and 71, and n-channel MOS transistors 72 and 73. Input and output terminals of the inverters 70 and 71 are connected to each other via nodes LAT and INV. As will be described later, the sense amplifier portion SA is configured to be operated when a potential of the node INV has an "L" level. The sense amplifier portion SA, however, may be configured to be operated when a potential of the node INV has an "H" level. The sense amplifier portion SA may refer to a potential of the node LAT. For example, circuit configurations of the latch circuits ADL, BDL, and XDL are the same as that of the latch circuit SDL, and thus description thereof will be omitted.

One end of the transistor 60 is connected to a power source line, and a gate of the transistor 60 is connected to the node INV of the latch circuit SDL. For example, a voltage VDD which is a power source voltage of the semiconductor memory 10 is applied to the power source line connected to one end of the transistor 60. One end of the transistor 61 is connected to the other end of the transistor 60, the other end of the transistor 61 is connected to a node COM, and a control signal BLX is input to a gate of the transistor 61.

One end of the transistor 62 is connected to the node COM, and a control signal BLC is input to a gate of the transistor 62. The transistor 63 is, for example, a high breakdown voltage n-channel MOS transistor. One end of the transistor 63 is connected to the other end of the transistor 62, the other end of the transistor 63 is connected to the corresponding bit line BL, and a control signal BLS is input to a gate of the transistor 63.

One end of the transistor 64 is connected to the node COM, the other end of the transistor 64 is connected to a node SRC, and a gate of the transistor 64 is connected to the node INV of the latch circuit SDL. For example, a voltage VSS which is a ground voltage of the semiconductor memory 10 is applied to the node SRC. One end of the transistor 65 is connected to the other end of the transistor 60, the other end of the transistor 65 is connected to a node SEN, and a control signal HLL is input to a gate of the transistor 65.

One end of the transistor 66 is connected to the node SEN, the other end of the transistor 66 is connected to the node COM, and a control signal XXL is input to a gate of the transistor 66. One end of the transistor 67 is grounded, and a gate of the transistor 67 is connected to the node SEN.

One end of the transistor 68 is connected to the other end of the transistor 67, the other end of the transistor 68 is connected to a bus LBUS, and a control signal STB is input to a gate of the transistor 68. One end of the capacitor 69 is connected to the node SEN, and a clock CLK is input to the other end of the capacitor 69.

An input node of the inverter 70 is connected to the node LAT, and an output node of the inverter 70 is connected to the node INV. An input node of the inverter 71 is connected to the node INV, and an output node of the inverter 71 is connected to the node LAT.

One end of the transistor 72 is connected to the node INV, the other end of the transistor 72 is connected to the bus LBUS, and a control signal STI is input to a gate of the transistor 72. One end of the transistor 73 is connected to the node LAT, the other end of the transistor 73 is connected to the bus LBUS, and a control signal STL is input to a gate of the transistor 73.

The control signals BLX, BLC, BLS, HLL, XXL, and STB described above are generated by, for example, the sequencer 14. A timing at which the sense amplifier portion SA determines data read to the bit line BL is based on a timing at which the control signal STB is asserted.

In the following description, "the control signal STB being asserted" corresponds to a case where the sequencer 14 temporarily changes the control signal STB from an "L" level to an "H" level. Depending on a configuration of the sense amplifier module 17, an operation such as "the control signal SIB being asserted" may correspond to a case where the sequencer 14 temporarily changes the control signal STB from an "H" level to an "L" level.

The sense amplifier module 17 in the first embodiment is not limited to the above-described configuration, and a configuration thereof may be variously modified. For example, the number of latch circuits in the sense amplifier unit SAU may be changed as appropriate based on an applied write method.

1-2. Operation

In a case where error correction fails in a page on which a read operation is performed, the memory system 1 according to the first embodiment performs re-reading of the page again. In the re-reading, the memory system 1 performs, for example, a tracking read to search for an optimal read voltage. Hereinafter, a description will be made of details of the tracking read performed during re-reading of the present embodiment.

Figure 11:
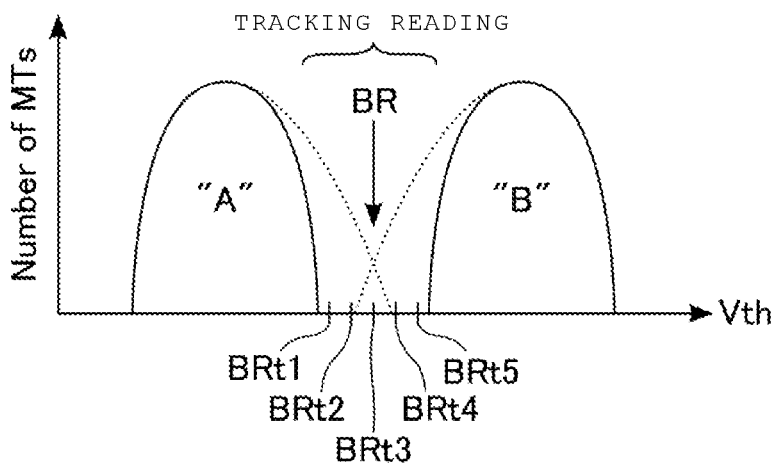
FIG. 11 is a threshold voltage distribution diagram for explaining a tracking read performed in the memory system according to the first embodiment.

FIG. 11 illustrates examples of threshold voltage distributions in the memory cell transistor MT respectively corresponding to the "A" level and the "B" level. A solid line in FIG. 11 corresponds to an ideal threshold voltage distribution, and a dashed line indicates a threshold voltage distribution after the threshold voltage changes.

In a case where the memory cell transistor MT has an ideal threshold voltage distribution, read voltages AR, BR, and CR which are set in advance as read voltages to be applied to the selected word line WLsel during a read operation may be used.

However, a threshold voltage distribution in the memory cell transistor MT may be different from an ideal threshold voltage distribution as illustrated in FIG. 11. For example, even if a threshold voltage of the memory cell transistor MT is ideally distributed right after a write operation, the threshold voltage may be reduced with the passage of time, or the threshold voltage may increase due to program disturbance or read disturbance.

In the memory cell transistor MT in which write and erasing cycles are repeated, data retention characteristics may deteriorate, and thus a change in the threshold voltage may further increase. If such a change in the threshold voltage occurs, there is a probability that the number of error bits may increase in a read operation using the read voltages set in advance, and thus error correction may be difficult.

In contrast, in the tracking read, a read operation using a plurality of read voltages is performed, and an optimal read voltage is obtained. Specifically, in the tracking read, for example, in a case where error correction fails in a read operation using the read voltage BR, the memory system 1 performs a read operation using tracking voltages BRt1, BRt2, BRt3, BRt4, and BRt5.

Such voltage values are set to any values, and an interval between tracking voltages adjacent to each other is set to be substantially constant, for example. A relationship of the voltage values is BRt1<BRt2<BRt3<BRt4<BRt5. A relationship with the predetermined read voltage BR is BRt1<BR<BRt5. Tracking voltages are also set for other read voltages in the same manner. The number of tracking voltages set to correspond to each read voltage may be set to any number.

In the tracking read, for example, if a read operation using the tracking voltages BRt1, BRt2, BRt3, BRt4, and BRt5 is performed, the semiconductor memory 10 may detect a valley between a threshold voltage distribution in the "A" level and a threshold voltage distribution in the "B" level based on, for example, the number of ON cells of the memory cell transistors MT, and may thus estimate an optimal read voltage.

The semiconductor memory 10 can perform a read operation with higher accuracy than in a read operation using a predetermined read voltage by using the estimated optimal read voltage. In the present specification, "high accuracy" in a read operation indicates that the occurrence of an error bit in a read operation is reduced. For example, one of tracking voltages used for tracking read is set as an optimal read voltage.

In the memory system 1 according to the first embodiment, for example, in a case where error correction fails again in tracking read during re-reading, tracking read with higher accuracy is performed. Hereinafter, the tracking read with high accuracy will be referred to as first reading. Details of the first reading will be described later.

Figure 12:
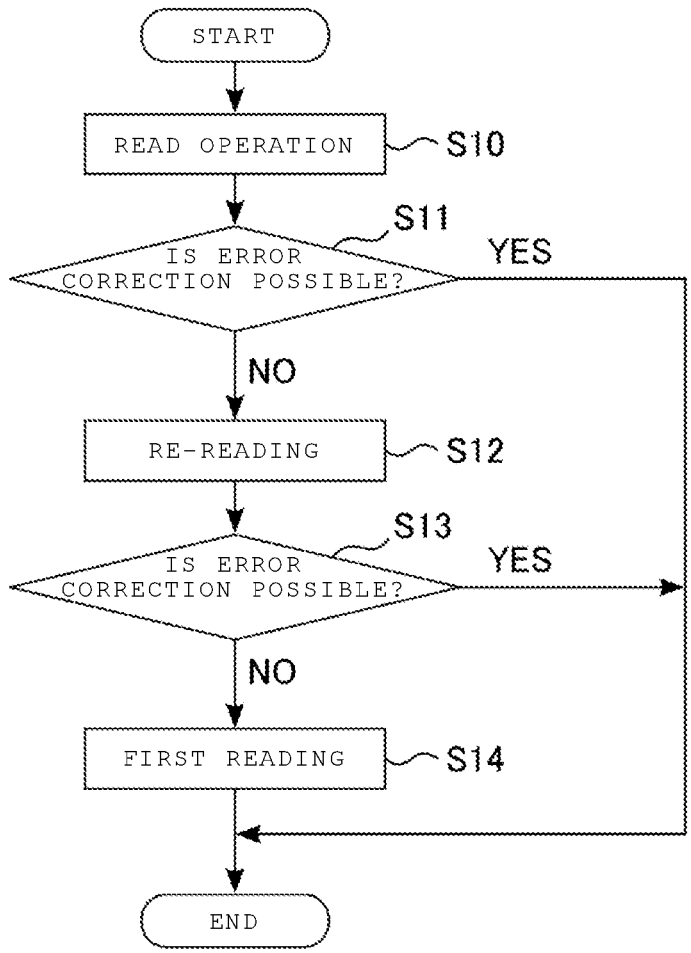
FIG. 12 is a flowchart illustrating an example of a read operation in the memory system according to the first embodiment.

FIG. 12 is a flowchart illustrating an example of a read operation in the memory system 1 according to the first embodiment, and illustrates an example of a series of operations from a read operation of selecting a certain cell unit CU until re-reading is performed twice.

As illustrated in FIG. 12, first, the memory system 1 performs a read operation based on an instruction from the host apparatus 30 (step S10). In the read operation, the semiconductor memory 10 reads data of a selected page of the selected cell unit CU based on an instruction from the memory controller 20, and transmits the read data to the memory controller 20. The ECC circuit 25 of the memory controller 20 performs error correction on the read data received from the semiconductor memory 10.

In a case where error correction of the read data in step S10 is possible (YES in step S11), the memory system 1 transmits the corrected read data to the host apparatus 30, and finishes the read operation on the page. On the other hand, in a case where error correction of the read data is not possible (NO in step S11), the memory system 1 performs re-reading of the page (step S12).

In the re-reading, the semiconductor memory 10 performs, for example, the above-described tracking read based on an instruction from the memory controller 20, and transmits the read data to the memory controller 20. The ECC circuit 25 of the memory controller 20 performs error correction on the read data received from the semiconductor memory 10.

In a case where error correction of the read data in step S12 is possible (YES in step S13), the memory system 1 transmits the corrected read data to the host apparatus 30, and finishes the read operation on the page. On the other hand, in a case where error correction of the read data is not possible (NO in step S13), the memory system 1 performs first reading of the page (step S14).

In the first reading, the semiconductor memory 10 performs the tracking read for each of a plurality of regions RG. Specifically, the semiconductor memory 10 classifies the bit lines BL into a group (hereinafter, referred to as a group of the region RG1) of the bit lines BL connected to the memory pillars MH provided in the region RG1, a group (hereinafter, referred to as a group of the region RG2) of the bit lines BL connected to the memory pillars MH provided in the region RG2, a group (hereinafter, referred to as a group of the region RG3) of the bit lines BL connected to the memory pillars MH provided in the region RG3, and a group (hereinafter, referred to as a group of the region RG4) of the bit lines BL connected to the memory pillars MH provided in the region RG4, and separately performs tracking read on each group.

Figure 13:
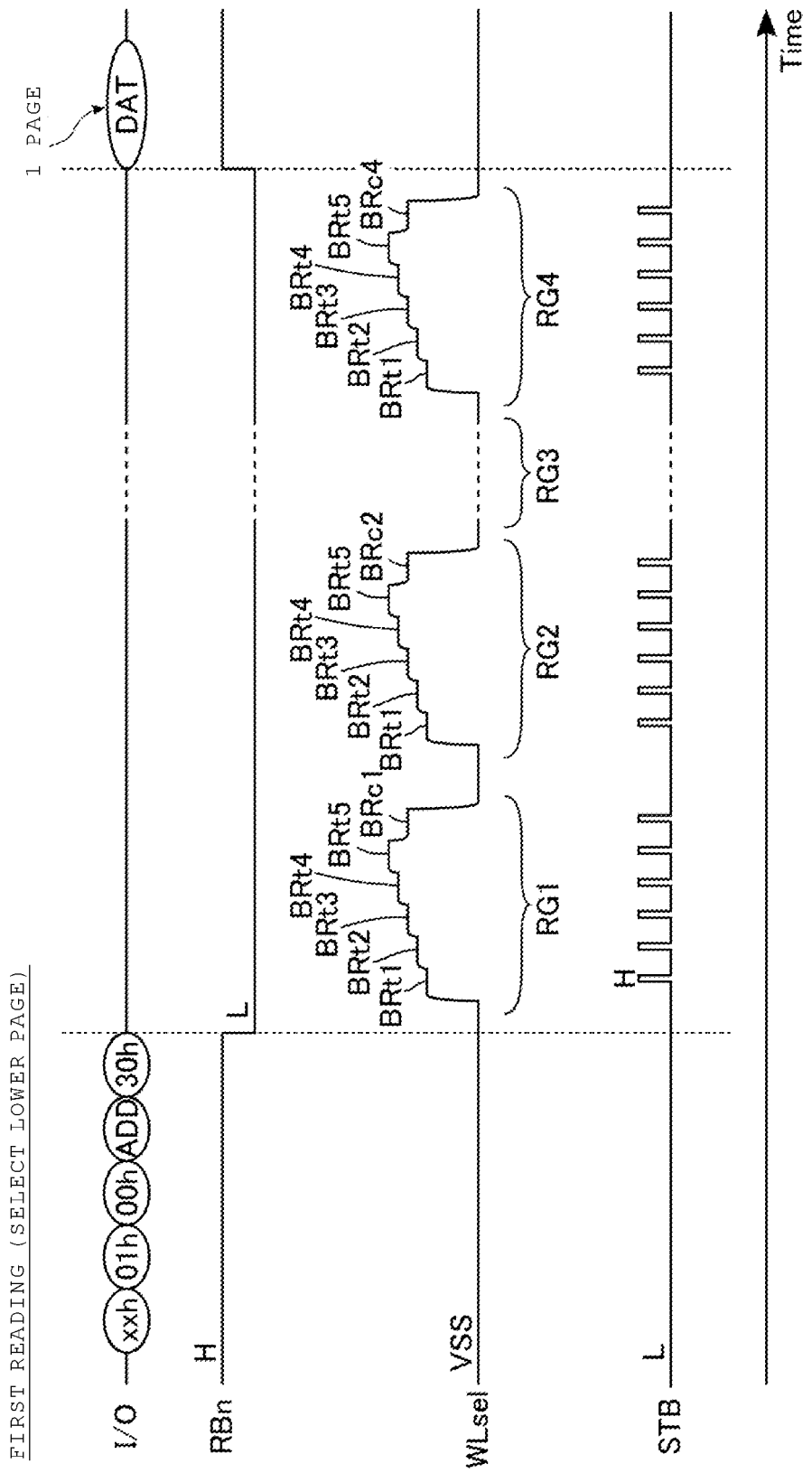
FIG. 13 is a timing chart illustrating examples of commands, and signals and voltages of respective lines during reading of a lower page in the memory system according to the first embodiment.
Figure 14:
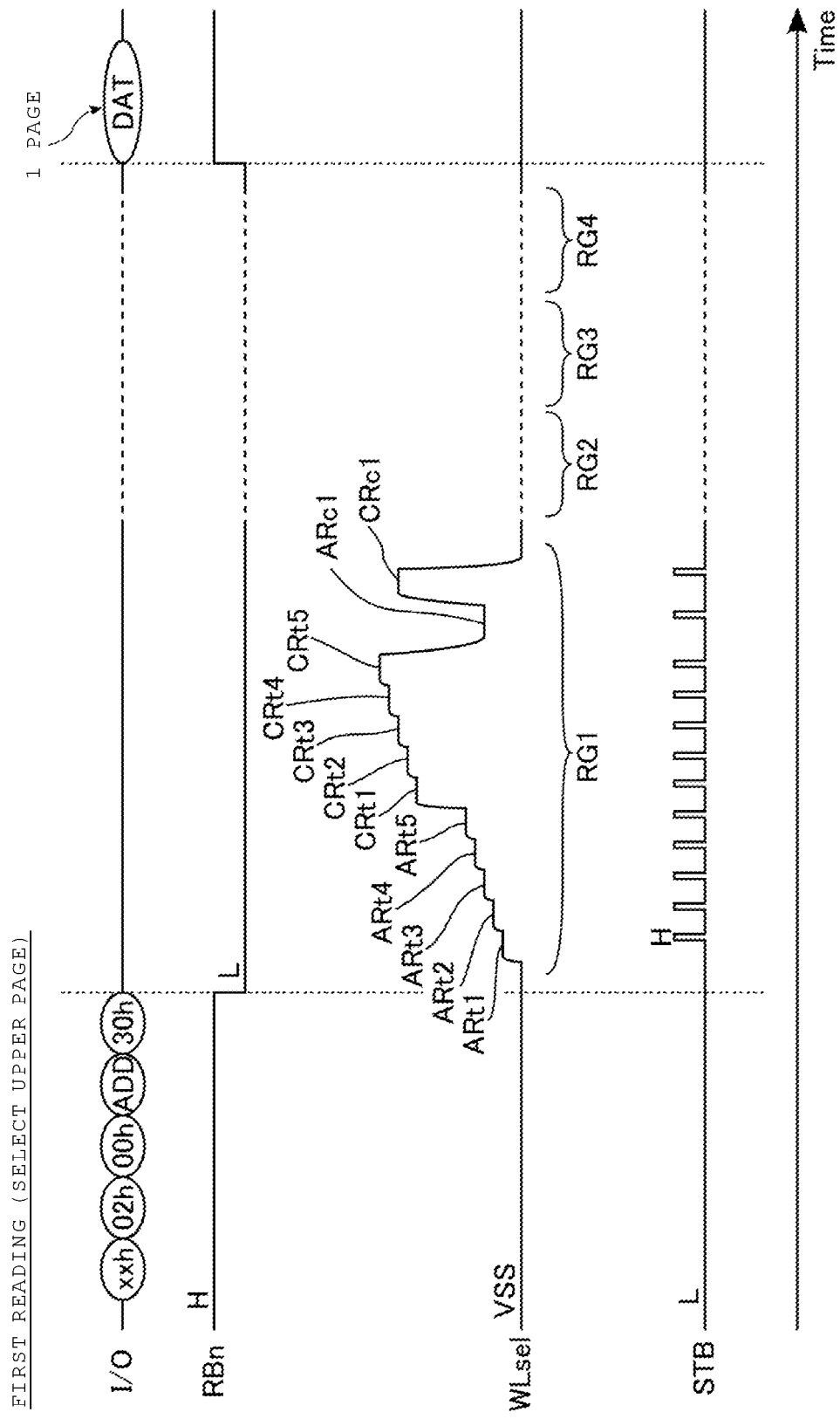
FIG. 14 is a timing chart illustrating examples of commands, and signals and voltages of respective lines during reading of an upper page in the memory system according to the first embodiment.

Hereinafter, with reference to FIGS. 13 and 14, a description will be made of details of first reading in the memory system 1 according to the first embodiment. Each of FIGS. 13 and 14 illustrates commands and addresses which are input to the semiconductor memory 10, the ready/busy signal RBn, a voltage of the selected word line WLsel, and the control signal STB. FIG. 13 corresponds to a waveform in first reading in a case where a lower page is selected, and FIG. 14 corresponds to a waveform in first reading in a case where an upper page is selected.

First, a description will be made of first reading in a case where a lower page is selected. In first reading in which a lower page is selected, as illustrated in FIG. 13, the memory controller 20 sequentially transmits, for example, a command "xxh", a command "01h", a command "00h", the address information ADD, and a command "30h" to the semiconductor memory 10.

The command "xxh" is a command for instructing the semiconductor memory 10 to perform division tracking read described below. The command "01h" is a command for instructing the semiconductor memory 10 to perform an operation corresponding to a lower page. The command "00h" is a command for instructing the semiconductor memory 10 to perform a read operation. The address information ADD includes information regarding an address corresponding to a selected cell unit CU. The command "30h" is a command for instructing the semiconductor memory 10 to perform a read operation based on received command and address.

In a case where the command "30h" is received, the semiconductor memory 10 transitions from a ready state (RBn: "H" level) to a busy state (RBn: "L" level), and the sequencer 14 performs first reading. A voltage of the word line WL before the sequencer 14 performs the first reading is set to, for example, VSS.

At the beginning of the first reading, the sequencer 14 sets, for example, "0" in the latch circuit ADL of each sense amplifier unit SAU. The sequencer 14 performs tracking read, for example, in the group of the region RG1.

In the tracking read in the group of the region RG1, first, the sequencer 14 sets "0" in the latch circuit SDL of the sense amplifier unit SAU corresponding to the group of the region RG1, and sets "1" in the latch circuits SDL of the sense amplifier units SAU corresponding to groups of other regions (specifically, the regions RG2, RG3, and RG4, that is, all regions other than the region RG1).

In the tracking read, the transistors 60 and 64 are respectively turned on and turned off in the sense amplifier unit SAU of which "0" is set in the latch circuit SDL, and thus the bit line BL is charged. In other words, in the tracking read, a read operation is performed on the memory cell transistor MT which corresponds to the sense amplifier unit SAU of which "0" is set in the latch circuit SDL, and is connected to the selected word line WLsel.

On the other hand, the transistors 60 and 64 are respectively turned off and turned on in the sense amplifier unit SAU of which "1" is set in the latch circuit SDL, and thus the bit line BL is not charged. In other words, in the tracking read, a read operation is not performed on the memory cell transistor MT which corresponds to the sense amplifier unit SAU of which "1" is set in the latch circuit SDL, and is connected to the selected word line WLsel.

In the present specification, for example, "0" set in the latch circuit SDL corresponds to a case where a potential of the node INV of the latch circuit SDL is an "L" level, and "1" set in the latch circuit SDL corresponds to a case where a potential of the node INV of the latch circuit SDL is an "H" level.

Next, the row decoder module 16 sequentially applies, for example, the tracking voltages BRt1, BRt2, BRt3, BRt4, and BRt5 to the selected word line WLsel, and the sequencer 14 asserts the control signal STB while each tracking voltage is applied to the selected word line WLsel.

If the control signal STB is asserted, the sense amplifier unit SAU corresponding to the group of the region RG1 senses data of the memory cell transistor MT connected to the selected word line WLsel based on a voltage of the corresponding bit line BL. A sensing result (which may also be referred to as a reading result) based on each tracking voltage is stored in the latch circuit SDL, and is transmitted to the sequencer 14 via the latch circuit XDL.

In this case, as the reading result transmitted to the sequencer 14, the number of ON cells of the memory cell transistors MT corresponding to the region RG is used. The sequencer 14 estimates an optimal read voltage BRc1 in the group of the region RG1 based on reading results based on the read voltages BRt1 to BRt5 in the sense amplifier unit SAU corresponding to the group of the region RG1.

Thereafter, the row decoder module 16 applies the optimal read voltage BRc1 estimated by the sequencer 14 to the selected word line WLsel, and the sequencer 14 asserts the control signal STB while the optimal read voltage BRc1 is applied to the selected word line WLsel.

If the control signal STB is asserted, the sense amplifier unit SAU corresponding to the group of the region RG1 senses data of the memory cell transistor MT connected to the selected word line WLsel based on a voltage of the corresponding bit line BL. In other words, it is determined whether or not a threshold voltage of the memory cell transistor MT exceeds the read voltage BRc1.

The sense amplifier unit SAU corresponding to the group of the region RG1 stores a reading result based on the read voltage BRc1 in the latch circuit SDL, and then transmits the reading result to the latch circuit ADL. In the first reading, the reading result using the optimal read voltage BRc1 is used as a reading result in the memory cell transistor MT corresponding to the group of the region RG1.

As mentioned above, tracking read in which an optimal read voltage is estimated in the unit of the region RG, and a read operation using the optimal read voltage is performed in the unit of the region RG will be referred to as division tracking read.

Next, the sequencer 14 performs division tracking read for each group of the regions RG2, RG3, and RG4 in the same manner as for the group of the region RG1.

Hereinafter, a brief description will be made of division tracking read for the groups of regions RG2, RG3, and RG4.

In the tracking read for the group of the region RG2, first, the sequencer 14 sets "0" in the latch circuit SDL of the sense amplifier unit SAU corresponding to the group of the region RG2, and sets "1" in the latch circuits SDL of the sense amplifier units SAU corresponding to groups of other regions (specifically, the regions RG1, RG3, and RG4, that is, all regions other than the region RG2).

Next, a read operation using the tracking voltages BRt1, BRt2, BRt3, BRt4, and BRt5 is performed, and an optimal read voltage BRc2 in the group of the region RG2 is estimated based on reading results in the group of the region RG2.

A read operation using the read voltage BRc2 is performed, and the sense amplifier unit SAU corresponding to the group of the region RG2 stores the reading result in the latch circuit SDL, and then transmits the reading result to the latch circuit ADL. In the first reading, the reading result using the optimal read voltage BRc2 is used as a reading result in the memory cell transistor MT corresponding to the group of the region RG2.

In the tracking read for the group of the region RG3, first, the sequencer 14 sets "0" in the latch circuit SDL of the sense amplifier unit SAU corresponding to the group of the region RG3, and sets "1" in the latch circuits SDL of the sense amplifier units SAU corresponding to groups of other regions (specifically, the regions RG1, RG2, and RG4, that is, all regions other than the region RG3).

Next, a read operation using the tracking voltages BRt1, BRt2, BRt3, BRt4, and BRt5 is performed, and an optimal read voltage BRc3 in the group of the region RG3 is estimated based on reading results.

A read operation using the read voltage BRc3 is performed, and the sense amplifier unit SAU corresponding to the group of the region RG3 stores the reading result in the latch circuit SDL, and then transmits the reading result to the latch circuit ADL. In the first reading, the reading result using the optimal read voltage BRc3 is used as a reading result in the memory cell transistor MT corresponding to the group of the region RG3.

In the tracking read for the group of the region RG4, first, the sequencer 14 sets "0" in the latch circuit SDL of the sense amplifier unit SAU corresponding to the group of the region RG4, and sets "1" in the latch circuits SDL of the sense amplifier units SAU corresponding to groups of other regions (specifically, the regions RG1, RG2, and RG3, that is, all regions other than the region RG4).

Next, a read operation using the tracking voltages BRt1, BRt2, BRt3, BRt4, and BRt5 is performed, and an optimal read voltage BRc4 in the group of the region RG4 is estimated based on reading results.

A read operation using the read voltage BRc4 is performed, and the sense amplifier unit SAU corresponding to the group of the region RG4 stores the reading result in the latch circuit SDL, and then transmits the reading result to the latch circuit ADL. In the first reading, the reading result using the optimal read voltage BRc4 is used as a reading result in the memory cell transistor MT corresponding to the group of the region RG4.

In the above-described division tracking read, as each tracking voltage applied to the selected word line WLsel, for example, the same voltage is used for each region RG. This is only an example, and different voltages may be used for each region RG as tracking voltages used in the first reading. An order of the above-described division may be performed in any order.

In a case where division tracking read corresponding to each group of the regions RG1 to RG4 is finished, the reading result based on the optimal read voltage estimated for each region RG is stored in the latch circuit ADL of each sense amplifier unit SAU.

Thereafter, the sequencer 14 transmits the data stored in the latch circuit ADL to the latch circuit XDL in each sense amplifier unit SAU, and causes the semiconductor memory 10 to transition from a busy state to a ready state.

If it is detected that the semiconductor memory 10 is in a ready state, the memory controller 20 controls the semiconductor memory 10 to output the reading results based on the first reading. Specifically, the memory controller 20 toggles, for example, the read enable signal REn, and thus causes the read data stored in the latch circuit XDL of each sense amplifier unit SAU to be output to the memory controller 20. In this case, the data which is output to the memory controller 20 from the semiconductor memory 10 corresponds to one page.

In the first reading, the semiconductor memory 10 may transition from a busy state to a ready state after division tracking read corresponding to each group of the regions RG1 to RG4 is finished. In this case, the memory controller 20 causes the semiconductor memory 10 to output the read data as described above after the data stored in the latch circuit ADL of each sense amplifier unit SAU is transmitted to the latch circuit XDL.

The read data which is output to the memory controller 20 includes read data which is read from the memory cell transistor MT corresponding to the region RG1 by using the optimal read voltage BRc1, read data which is read from the memory cell transistor MT corresponding to the region RG2 by using the optimal read voltage BRc2, read data which is read from the memory cell transistor MT corresponding to the region RG3 by using the optimal read voltage BRc3, and read data which is read from the memory cell transistor MT corresponding to the region RG4 by using the optimal read voltage BRc4.

The above-described operation corresponds to an example of the first reading in a case where a lower page is selected in the memory system 1 according to the first embodiment. The data which is read through the first reading is subjected to error correction in the ECC circuit 25 in the same manner as in the re-reading.

Next, a description will be made of first reading in a case where an upper page is selected. In first reading in which an upper page is selected, as illustrated in FIG. 14, the memory controller 20 sequentially transmits, for example, a command "xxh", a command "02h", a command "00h", the address information ADD, and a command "30h" to the semiconductor memory 10.

The command "02h" is a command for instructing the semiconductor memory 10 to perform an operation corresponding to an upper page. In a case where the command "30h" is received, the semiconductor memory 10 transitions from a ready state to a busy state, and the sequencer 14 performs first reading.

First, the sequencer 14 performs division tracking read, for example, in the group of the region RG1. In the tracking read in the group of the region RG1, first, the sequencer 14 sets "0" in the latch circuit SDL of the sense amplifier unit SAU corresponding to the group of the region RG1, and sets "1" in the latch circuits SDL of the sense amplifier units SAU corresponding to other regions (specifically, the regions RG2, RG3, and RG4, that is, all regions other than the region RG1).

Next, the row decoder module 16 sequentially applies, for example, tracking voltages ARt1, ARt2, ARt3, ARt4, ARt5, CRt1, CRt2, CRt3, CRt4, and CRt5 to the selected word line WLsel, and the sequencer 14 asserts the control signal STB while each tracking voltage is applied to the selected word line WLsel.

In the same manner as in the first reading of a lower page, the sequencer 14 estimates an optimal read voltage ARc1 based on reading results based on the respective tracking voltages ARt1 to ARt5, and estimates an optimal read voltage CRc1 based on reading results based on the respective tracking voltages CRt1 to CRt5.

Thereafter, the row decoder module 16 sequentially the optimal read voltages ARc1 and CRc1 in the group of the region RG1 to the selected word line WLsel, and the sequencer 14 asserts the control signal STB while the optimal read voltages ARc1 and CRc1 are applied to the selected word line WLsel.

If the control signal STB is asserted, the sense amplifier unit SAU corresponding to the group of the region RG1 senses data of the memory cell transistor MT connected to the selected word line WLsel based on a voltage of the corresponding bit line BL. In other words, it is determined whether or not a threshold voltage of the memory cell transistor MT is lower than the read voltage ARc1, or is higher than CRc1.

The sense amplifier unit SAU corresponding to the group of the region RG1 stores, for example, a reading result based on the read voltage ARc1 in the latch circuit SDL, and then transmits the reading result to the latch circuit ADL.

The sense amplifier unit SAU corresponding to the group of the region RG1 stores a reading result based on the read voltage CRc1 in the latch circuit SDL, then calculates read data of the upper page based on the reading result stored in the latch circuit ADL and the reading result stored in the latch circuit SDL, and stores a calculation result in the latch circuit ADL.

In the first reading in which an upper page is selected, the calculation result stored in the latch circuit ADL is used as a reading result in the memory cell transistor MT corresponding to the group of the region RG1.

The same applies hereinafter, and the sequencer 14 performs division tracking read in each group of the regions RG2, RG3, and RG4, and stores a reading result based on an optimal read voltage corresponding to each region RG in the latch circuit ADL. In the same manner as in the first reading of a lower page, the data stored in the latch circuit ADL is transmitted to the latch circuit XDL, and is then output to the memory controller 20. In this case, the data which is output to the memory controller 20 from the semiconductor memory 10 corresponds to one page.

Other detailed operations in first reading of an upper page are the same as that in first reading of a lower page, and thus description thereof will be omitted.

1-3. Effect of First Embodiment

According to the memory system 1 of the first embodiment described above, it is possible to improve the capability of reading (salvaging) data stored in the memory cell transistor MT. Hereinafter, a detailed effect of the first embodiment will be described.

For example, in a NAND flash memory in which memory cells are stacked in a three-dimensional manner, an interconnection corresponding to the word lines WL is formed in a tabular shape, and has a stacked structure. In a case where an acquired short-circuit defect or open defect occurs in the corresponding word line WL after data is written, an effective resistance value of the word line WL may change with a defect occurrence location as a boundary. In the present specification, the "resistance value of the word line WL" indicates a resistance value in the word line WL from a position of the contact plug CC to a position of the memory cell transistor MT, and is obtained by using, for example, a time constant RC. In other words, in the present specification, the "resistance value of the word line WL" is a concept indicating how easily a voltage is delivered from the position of the contact plug CC to the position of the memory cell transistor MT via the word line WL.

Figure 15:
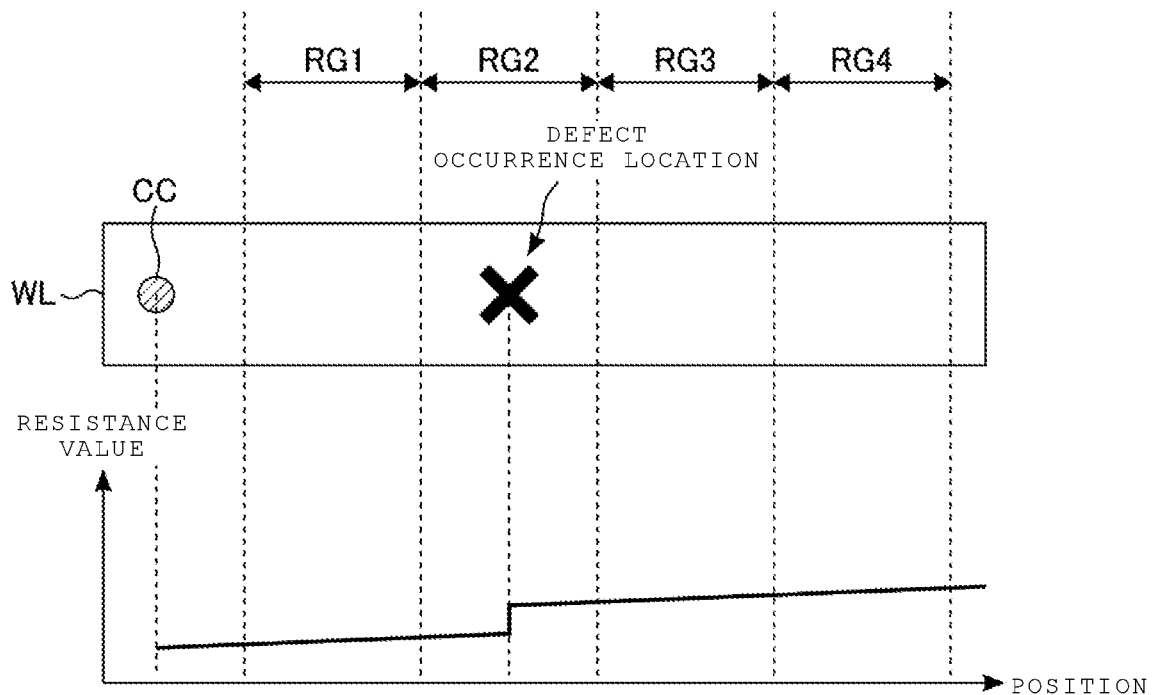
FIG. 15 is a schematic diagram illustrating an example of a location where a defect occurs in a word line and an example of a change in a resistance value of the word line in the memory system according to the first embodiment.

FIG. 15 illustrates an example of a change in a resistance value of the word line in a case where a defect occurs in the word line WL. An upper part in FIG. 15 illustrates a correspondence relationship between a single word line WL among a plurality of stacked word lines WL, and the regions RG1 to RG4, and the memory pillar MH passing through the word line WL is not illustrated. A lower part in FIG. 15 illustrates an example of a change in a resistance value between each position in the word line WL illustrated in the upper part in FIG. 15 and the contact plug CC.

As illustrated in FIG. 15, in a case where a defect occurs in the region RG2 in the word line WL, a resistance value may increase in a region before the defect occurrence location. In this case, an effective threshold voltage distribution for a voltage applied to the word line WL by the row decoder module 16 changes, for example, as illustrated in FIG. 16.

Figure 16:
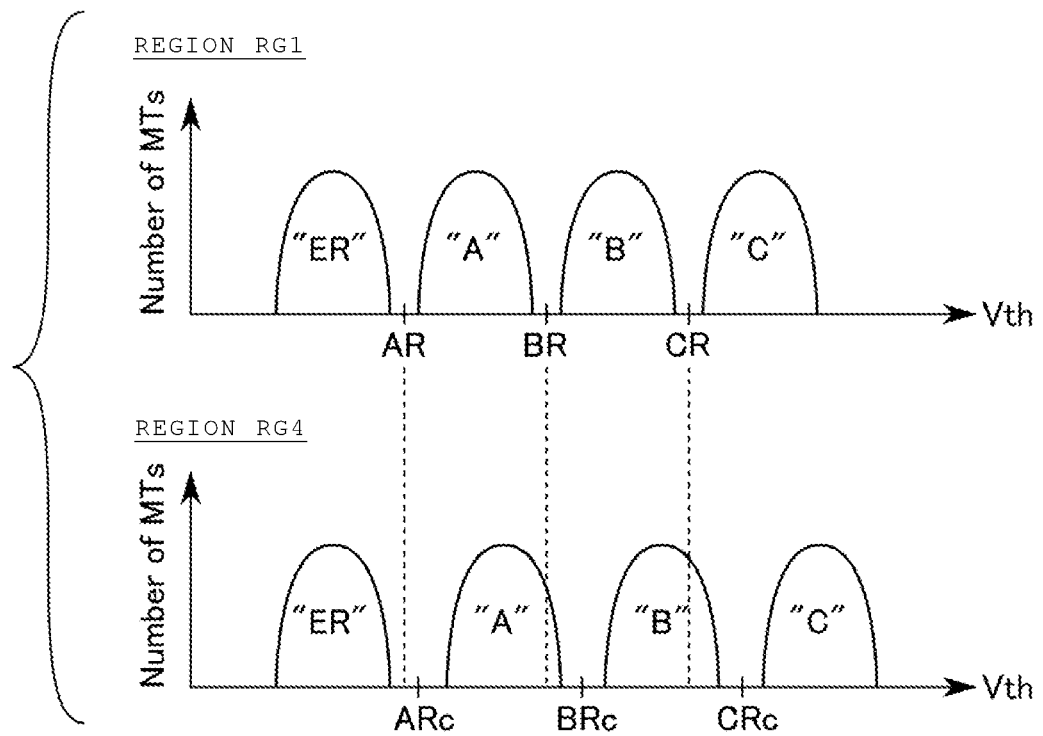
FIG. 16 is a threshold voltage distribution diagram illustrating an example of a change in a threshold voltage distribution for each region in which the defect occurs in the example illustrated in FIG. 15.

In the example illustrated in FIG. 16, a threshold voltage distribution in the memory cell transistor MT in the region RG4 appears to shift to an increase relative to a threshold voltage distribution in the memory cell transistor MT in the region RG1. This may occur since an effective voltage applied to the gate of the memory cell transistor MT corresponding to the region RG4 is lower than an effective voltage applied to the gate of the memory cell transistor MT corresponding to the region RG1 due to the increase in the resistance value of the word line WL in the region RG4.

Thus, there is a probability that an optimal read voltage in the region RG1 may be different from an optimal read voltage in the region RG4. For example, even if the typical read voltages AR, BR, and CR are optimal in the region RG1, read voltages typical read voltages ARc, BRc, and CRc which are respectively higher than the typical read voltages AR, BR, and CR may be optimal read voltages in the region RG4.

In this case, if tracking read of selecting a page of the cell unit CU is performed, the sequencer 14 estimates an optimal read voltage obtained through averaging in the regions RG1 to RG4. In other words, in terms of the unit of the region RG, an optimal read voltage estimated through tracking read (regular tracking read) may not be an appropriate voltage.

Therefore, the memory system 1 according to the first embodiment performs tracking read (division tracking read) in the unit of the region RG, for example, in re-reading after error correction fails. In the division tracking read, for example, the sequencer 14 extracts a reading result for the region RG1, estimates an optimal read voltage in the region RG1, and performs a read operation using the optimal read voltage corresponding to the region RG1. This operation is performed on other regions RG in the same manner.

Consequently, for example, as illustrated in FIG. 15, the memory system 1 according to the first embodiment can use an optimal read voltage in each of the regions RG2, RG3, and RG4 in which a resistance value increases, and can reduce the number of error bits of read data in each of the regions RG1 to RG4.

Therefore, for example, in a case where characteristics of the word line WL change due to an acquired defect, the memory system 1 according to the first embodiment can improve the capability of reading data written into the memory cell transistor MT corresponding to the word line WL. That is, even if the data cannot be read through the regular tracking read, the memory system 1 according to the first embodiment can salvage the data by performing the division tracking read.

Figure 17:
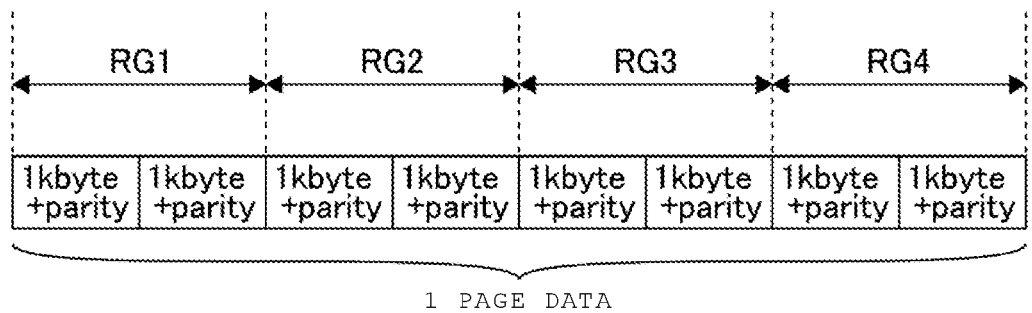
FIG. 17 is a diagram illustrating an example of allocation of 1-page data in the memory system according to the first embodiment.

In the above-described memory system 1 according to the first embodiment, 1-page data corresponding to a certain cell unit CU is arranged as illustrated in FIG. 17, for example. FIG. 17 illustrates an example of physical arrangement (corresponding to a physical address) of the memory cell transistors MT in the cell unit CU, and the physical arrangement may be different from logical arrangement (corresponding to a logical address).

As illustrated in FIG. 17, in the memory system 1 according to the first embodiment, two sets of data of a plurality of bits (for example, 1 kbyte) and a parity are designed to be provided in each region RG, for example. As mentioned above, since the sets of data and a parity are provided in the corresponding region RG, the memory system 1 according to the first embodiment can perform error correction on read data for each region RG.

Consequently, for example, even in a case where the region RG which cannot be read is provided in the cell unit CU on which division tracking read is performed, the memory system 1 according to the first embodiment can prevent a reduction in an amount of data which can be read. In the memory system 1, a method of arranging sets of data and a parity for the cell unit CU is not limited to the example illustrated in FIG. 17, and other arrangement methods may be used.

2. Second Embodiment

A configuration of the memory system 1 according to a second embodiment is the same as the configuration of the memory system 1 according to the first embodiment. In the memory system 1 according to the second embodiment, after re-reading, division tracking read of designating the region RG in which error correction fails is performed. Hereinafter, the memory system 1 according to the second embodiment will be described focusing on differences from the first embodiment.

2-1. Operation

Figure 18:
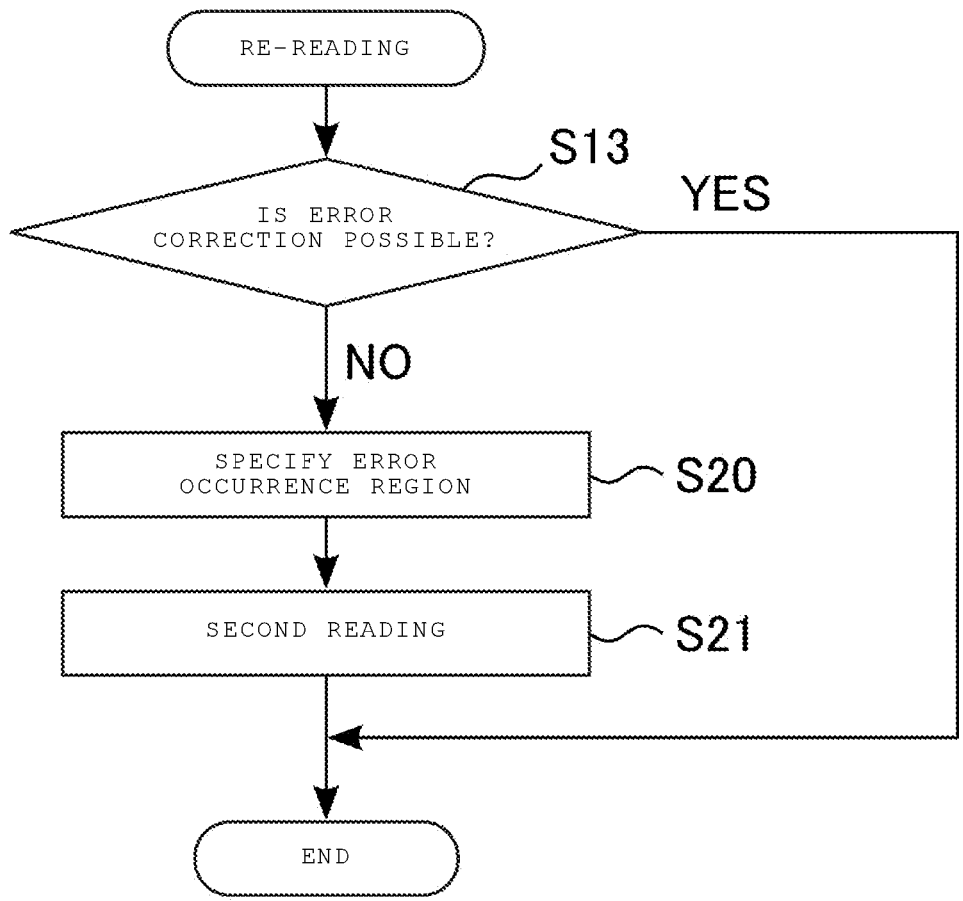
FIG. 18 is a flowchart illustrating an example of a read operation in a memory system according to a second embodiment.

FIG. 18 is a flowchart illustrating an example of a read operation of the memory system 1 according to the second embodiment, and illustrates an example of an operation subsequent to the re-reading in step S12 described with reference to FIG. 12 for the first embodiment.

As illustrated in FIG. 18, in a case where error correction of the read data is possible in the re-reading (YES in step S13), the memory system 1 transmits the corrected read data to the host apparatus 30, and finishes the read operation on the page.

On the other hand, in a case where error correction of the read data is not possible (NO in step S13), for example, the CPU 22 of the memory controller 20 extracts the column address CA at which an error occurs in the page based on an error correction result in the ECC circuit 25. The memory controller 20 instructs the semiconductor memory 10 to perform second reading by using a command set including the column address CA at which the error occurs.

If the semiconductor memory 10 receives the command set for giving an instruction for the second reading, for example, the sequencer 14 specifies the region RG in which the error occurs based on the column address CA in the command set (step S20).

The sequencer 14 performs second reading on the specified region RG (step S21). The second reading is division tracking read which is performed by selecting groups corresponding to some regions RG among the groups respectively corresponding to the regions RG1 to RG4.

Figure 19:
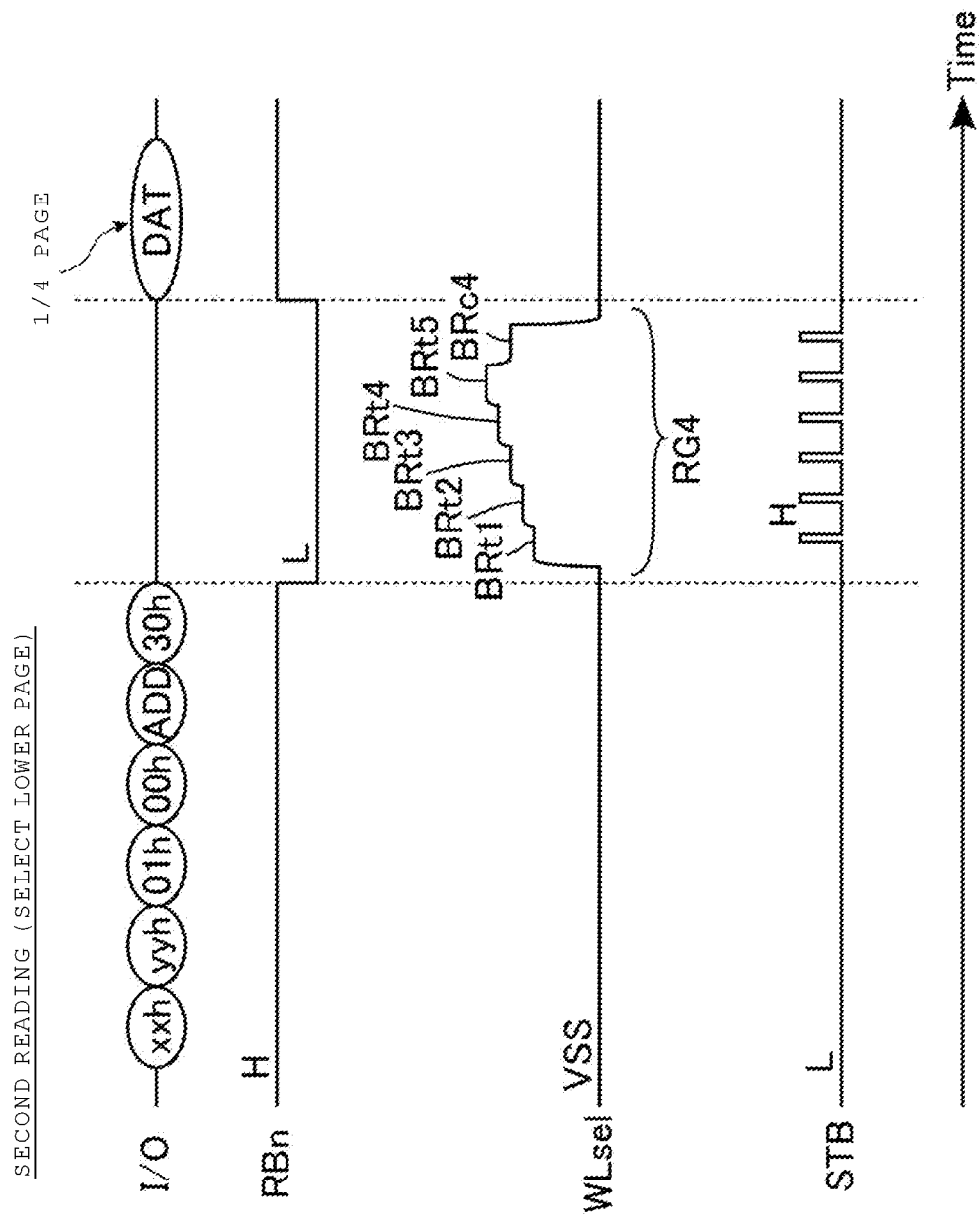
FIG. 19 is a timing chart illustrating examples of commands, and signals and voltages of respective lines during reading of a lower page in the memory system according to the second embodiment.

Hereinafter, with reference to FIG. 19, a description will be made of an example of second reading in the memory system 1 according to the second embodiment. FIG. 19 illustrates commands and addresses which are input to the semiconductor memory 10, the ready/busy signal RBn, a voltage of the selected word line WLsel, and the control signal STB. In the following description, for simplification of description, a description will be made of only an operation in a case where a lower page is selected.

First, as illustrated in FIG. 19, the memory controller 20 sequentially transmits, for example, a command "xxh", a command "yyh", a command "01h", a command "00h", the address information ADD, and a command "30h" to the semiconductor memory 10.

The command "yyh" is a command for instructing division tracking read of designating the region RG to be performed, and includes, for example, information for designating a group or groups corresponding to a single region RG or a plurality of regions RG. The address information ADD in a command set regarding second reading includes the column address CA at which error correction fails.

In a case where the command "30h" is received, the semiconductor memory 10 transitions from a ready state to a busy state, and the sequencer 14 performs second reading.

For example, in a case where the region RG specified in step S20 is the region RG4, the sequencer 14 performs division tracking read in the group of the region RG4. A detailed description of the division tracking read is the same as the division tracking read described in the first embodiment, and thus a description thereof will be omitted.

If it is detected that the division tracking read in the group of the designated region RG is finished, the sequencer 14 causes the semiconductor memory 10 to transition from a busy state to a ready state. Thereafter, the semiconductor memory 10 outputs a reading result in the group corresponding to the selected region RG to the memory controller 20 under the control of the memory controller 20. In this case, the data which is output from the semiconductor memory 10 to the memory controller 20 corresponds to, for example, ¼ pages. As mentioned above, a capacity of data which is output in the second reading is changed based on the number of selected regions RG.

In the second embodiment, a reading result corresponding to the region RG which is not designated may be output, and may not be output. In a case where a reading result corresponding to the region RG which is not designated is output, the memory controller 20 handles the received read data as invalid data. Other detailed operations in the second reading are the same as that in the first reading described in the first embodiment, and thus description thereof will be omitted.

2-2. Effect of Second Embodiment

According to the above-described memory system 1 of the second embodiment, it is possible to improve the capability of reading data stored in the memory cell transistor MT in the same manner as in the first embodiment.

Hereinafter, a detailed effect of the second embodiment will be described.

Figure 20:
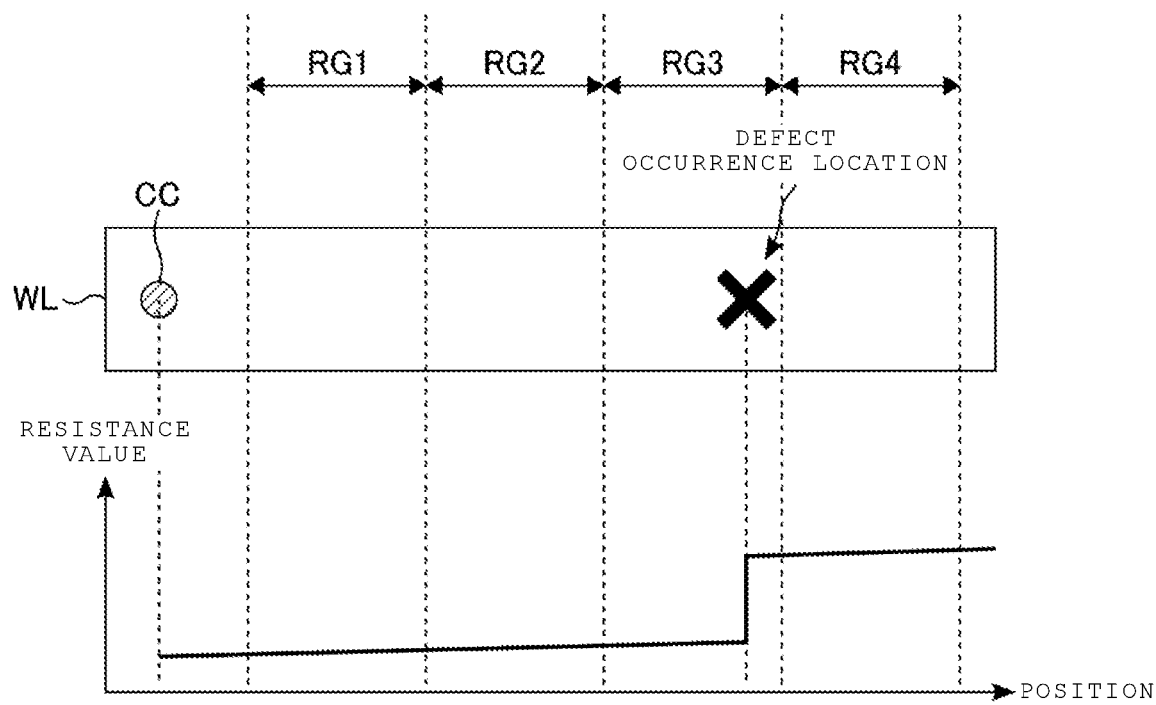
FIG. 20 is a schematic diagram illustrating an example of a location where a defect occurs in a word line and an example of a change in a resistance value of the word line in the memory system according to the second embodiment.

FIG. 20 illustrates an example of a change in a resistance value of the word line in a case where a defect occurs in the word line WL in the same manner as in FIG. 15 described in the first embodiment. In the example illustrated in FIG. 20, a defect occurs in the word line WL around a boundary between the region RG3 and the region RG4, and a resistance value of the word line WL considerably changes with the defect occurrence location as a boundary.

In the example illustrated in FIG. 20, if typical tracking read is performed, an estimated optimal read voltage may have a value close to an optimal read voltage corresponding to each group of the regions RG1 to RG3, and may thus have a value separated from an optimal read voltage corresponding to the group of the region RG4. In this case, error correction may be successful for read data corresponding to each group of the regions RG1 to RG3, and error correction may fail for read data corresponding to the group of the region RG4.

Therefore, the memory system 1 according to the second embodiment selects the region RG in which error correction fails, and performs the division tracking read described in the first embodiment. In the second embodiment, the semiconductor memory 10 outputs, for example, only a tracking read result corresponding to the region RG in which error correction fails to the memory controller 20.

Consequently, in the second reading in the memory system 1 according to the second embodiment, the number of regions RG which are division tracking read targets can be reduced more than in the first reading described in the first embodiment, and an amount of transmitted data in the second reading can be reduced more than an amount of transmitted data in the first reading. Therefore, the memory system 1 according to the second embodiment can reduce the time required for a data reading operation more than in the first embodiment.

3. Third Embodiment

A configuration of the memory system 1 according to a third embodiment is the same as the configuration of the memory system 1 according to the first embodiment. In the memory system 1 according to the third embodiment, after re-reading, division tracking read is performed in the region RG which is reset based on the region RG in which error correction fails. Hereinafter, the memory system 1 according to the third embodiment will be described focusing on differences from the first and second embodiments.

3-1. Operation

Figure 21:
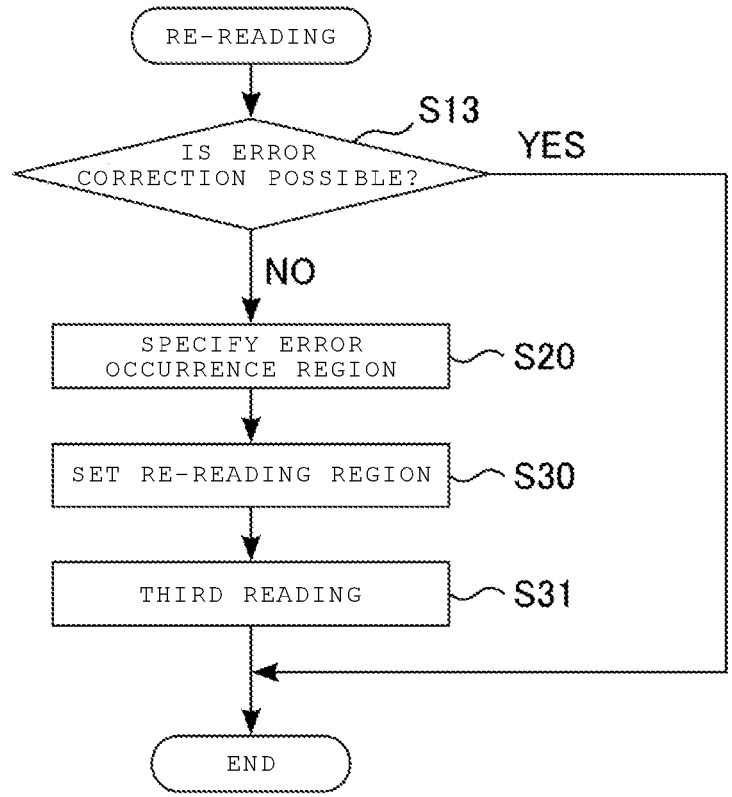
FIG. 21 is a flowchart illustrating an example of a read operation in a memory system according to a third embodiment.

FIG. 21 is a flowchart illustrating an example of a read operation of the memory system 1 according to the third embodiment, and illustrates an example of an operation subsequent to the re-reading in step S12 described with reference to FIG. 12 for the first embodiment.

As illustrated in FIG. 21, in a case where error correction of the read data is possible in the re-reading (YES in step S13), the memory system 1 transmits the corrected read data to the host apparatus 30, and finishes the read operation on the page.

On the other hand, in a case where error correction of the read data is not possible (NO in step S13), for example, the CPU 22 of the memory controller 20 extracts the column address CA at which an error occurs in the page based on an error correction result in the ECC circuit 25. The memory controller 20 instructs the semiconductor memory 10 to perform third reading by using a command set including the column address CA at which the error occurs.

If the semiconductor memory 10 receives the command set for giving an instruction for the third reading, for example, the sequencer 14 specifies the region RG in which the error occurs based on the column address CA in the command set (step S20).

The sequencer 14 sets the region RG on which division tracking read will be performed based on information regarding the specified region RG (step S30), and performs third reading (step S31).

Figure 22:
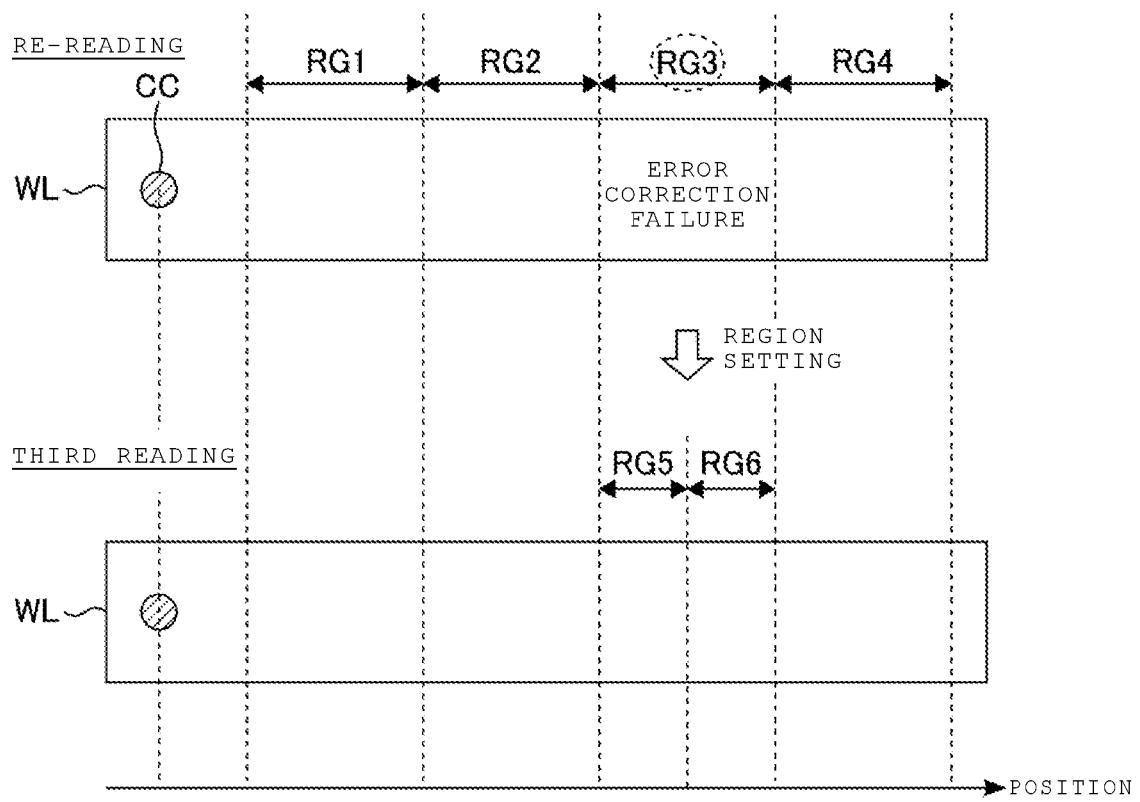
FIG. 22 is a schematic diagram illustrating an example of a region setting method during reading in the memory system according to the third embodiment.
Figure 23:
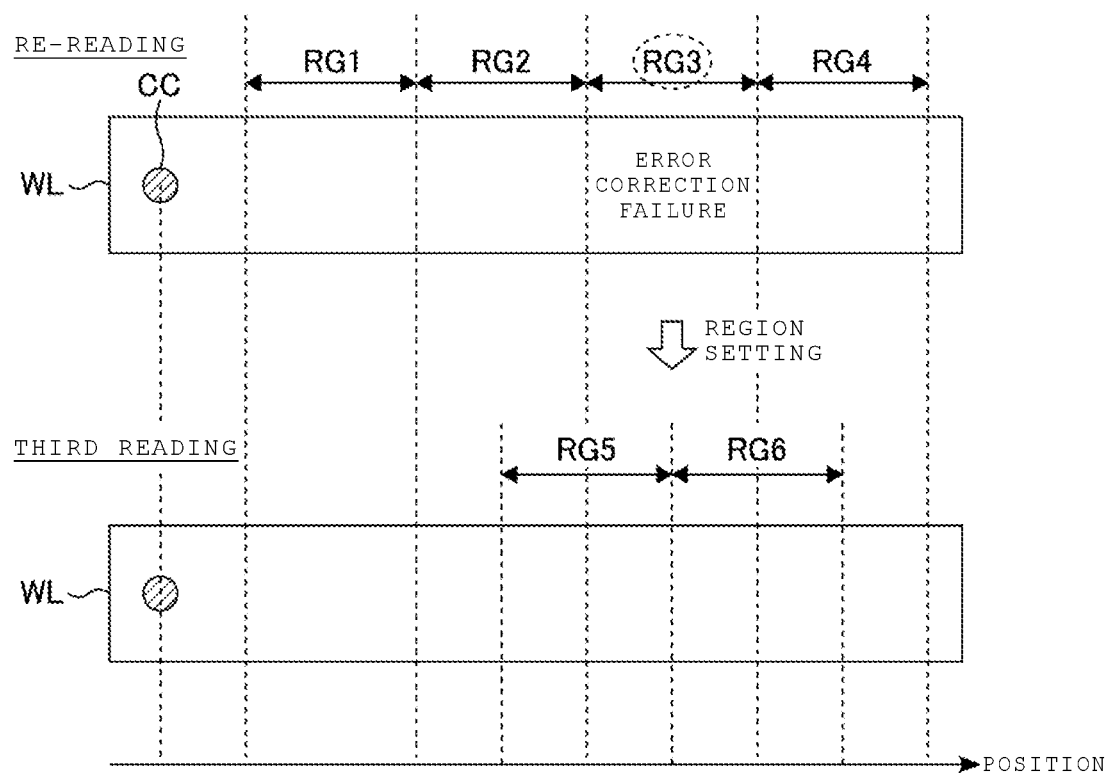
FIG. 23 is a schematic diagram illustrating an example of a region setting method during reading in the memory system according to the third embodiment.

Here, with reference to FIGS. 22 and 23, a description will be made of an example of the region RG set in step S30. FIGS. 22 and 23 respectively illustrate an example of the region RG in which error correction fails in re-reading, and an example of the region RG which is set in third reading.

In a case where error correction of read data corresponding to the group of the region RG3 fails in re-reading, for example, as illustrated in FIG. 22, the region RG in which an error occurs is divided into two or more regions RG (for example, the regions RG5 and RG6), and the separate regions RG are set as division tracking read targets.

This is only an example, and, in a case where error correction of read data corresponding to the group of the region RG3 fails, for example, as illustrated in FIG. 23, the regions RG (for example, the regions RG5 and RG6) obtained by sliding a range designated by the region RG outside a range of the region RG are set, and the set regions RG are set as division tracking read targets.

As mentioned above, in the third embodiment, the sequencer 14 may set any region RG in setting of the region RG in step S30. As the minimum range of the region RG, a range is set in which the sequencer 14 can estimate a valley of threshold voltage distributions adjacent to each other through division tracking read.

In the third reading, each operation based on a command and an address which are input to the semiconductor memory 10, the ready/busy signal RBn, a voltage of the selected word line WLsel, and the control signal STB is the same as in the second embodiment described in the second embodiment, and thus description thereof will be omitted.

In a case where the second reading and the third reading are separately used, the memory system 1 may allocate, for example, a command which is different from the command "yyh" to the third reading. The second reading and the third reading may be separately used by changing operation settings of the semiconductor memory 10.

The third reading described in the third embodiment may be combined with the first reading described in the first embodiment. For example, it is assumed that, as described in the first embodiment, the first reading is performed, and an optimal read voltage cannot be estimated in division tracking read in the region RG3 during execution of the first reading.

In this case, in the same manner as in the third reading, the sequencer 14 may perform division of a region and/or sliding of a region on the region RG3, and may perform division tracking read on the set region again. The sequencer 14 may perform the same operation as in the third reading a plurality of times during execution of the first reading by changing a set region.

3-2. Effect of Third Embodiment

According to the above-described memory system 1 of the third embodiment, it is possible to improve the capability of reading data stored in the memory cell transistor MT more than in the second embodiment. Hereinafter, a detailed effect of the third embodiment will be described.

Figure 24:
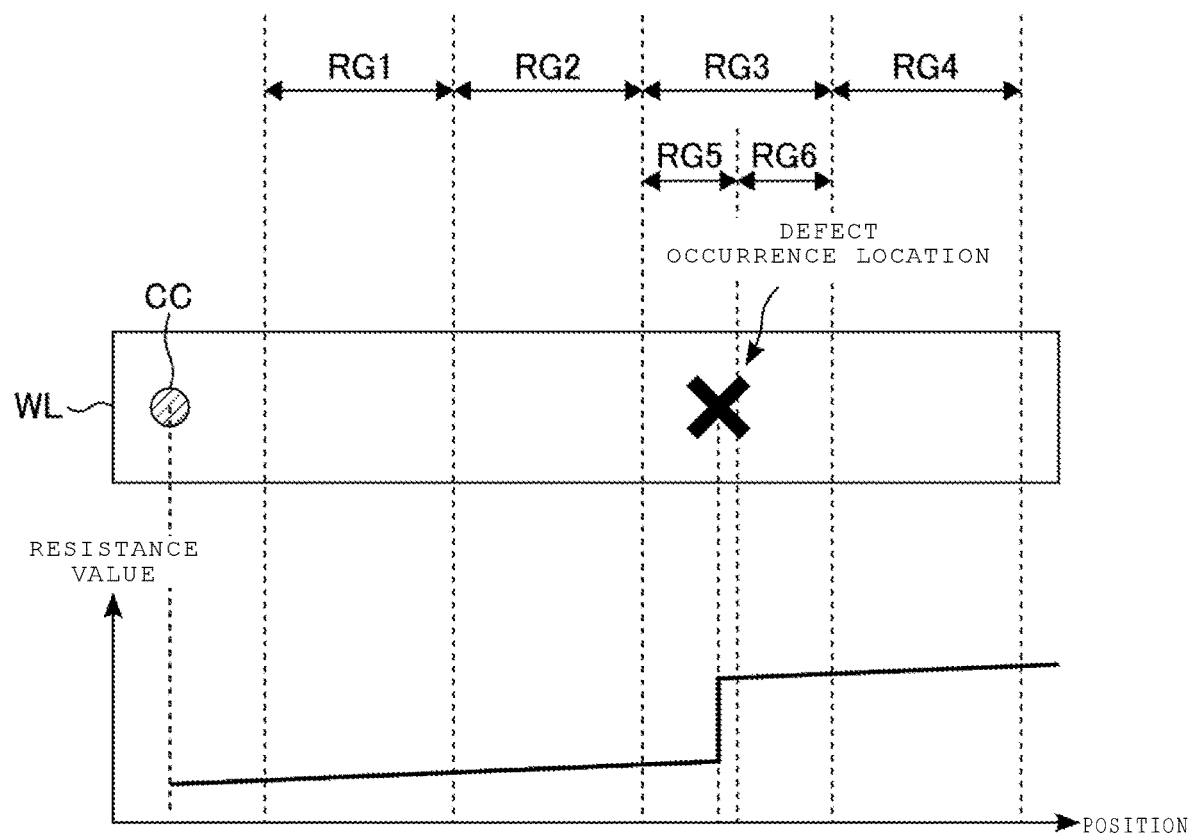
FIG. 24 is a schematic diagram illustrating an example of a location where a defect occurs in a word line and an example of a change in a resistance value of the word line in the memory system according to the third embodiment.

FIG. 24 illustrates an example of a change in a resistance value of the word line in a case where a defect occurs in the word line WL in the same manner as in FIG. 15 described in the first embodiment. In the example illustrated in FIG. 24, a defect occurs in the word line WL inside the region RG3, and a resistance value of the word line WL considerably changes with the defect occurrence location as a boundary.

In the example illustrated in FIG. 24, for example, portions in which optimal read voltages are considerably different from each other are provided in the region RG3, and thus there is a possibility that data cannot be accurately read even in a case where division tracking read of selecting the group of the region RG3 is performed.

Therefore, the memory system 1 according to the third embodiment resets the region RG based on the region RG in which error correction fails, and performs division tracking read. Specifically, in the third embodiment, as in FIG. 24, the sequencer 14 divides the region RG corresponding to a defect occurrence location into finer regions (for example, the regions RG5 and RG6), and performs division tracking read on the respective separate regions RG.

Consequently, the memory system 1 according to the third embodiment can improve a success proportion of error correction in the region RG not including a defect occurrence location among the separate regions RG, and can reduce a storage capacity corresponding to the region RG including the defect occurrence location in which error correction is difficult.

Since the unit of the region RG including a defect occurrence location is reduced, a total time required for reading data is increased, but a possibility that a more optimal read voltage can be set in the region RG through division tracking read. Therefore, it is possible to reduce the number of error bits.

As mentioned above, even in a case where the region RG which cannot be read is provided in the cell unit CU on which division tracking read is performed, the memory system 1 according to the third embodiment can prevent a reduction in an amount of data which can be read more than in the second embodiment, and can thus improve data reading capability.

4. Fourth Embodiment

A configuration of the memory system 1 according to a fourth embodiment is the same as the configuration of the memory system 1 according to the first embodiment. In the memory system 1 according to the fourth embodiment, after re-reading, division tracking read is performed in which the region RG in which error correction fails, and a voltage condition is changed. Hereinafter, the memory system 1 according to the fourth embodiment will be described focusing on differences from the first to third embodiments.

4-1. Operation

Figure 25:
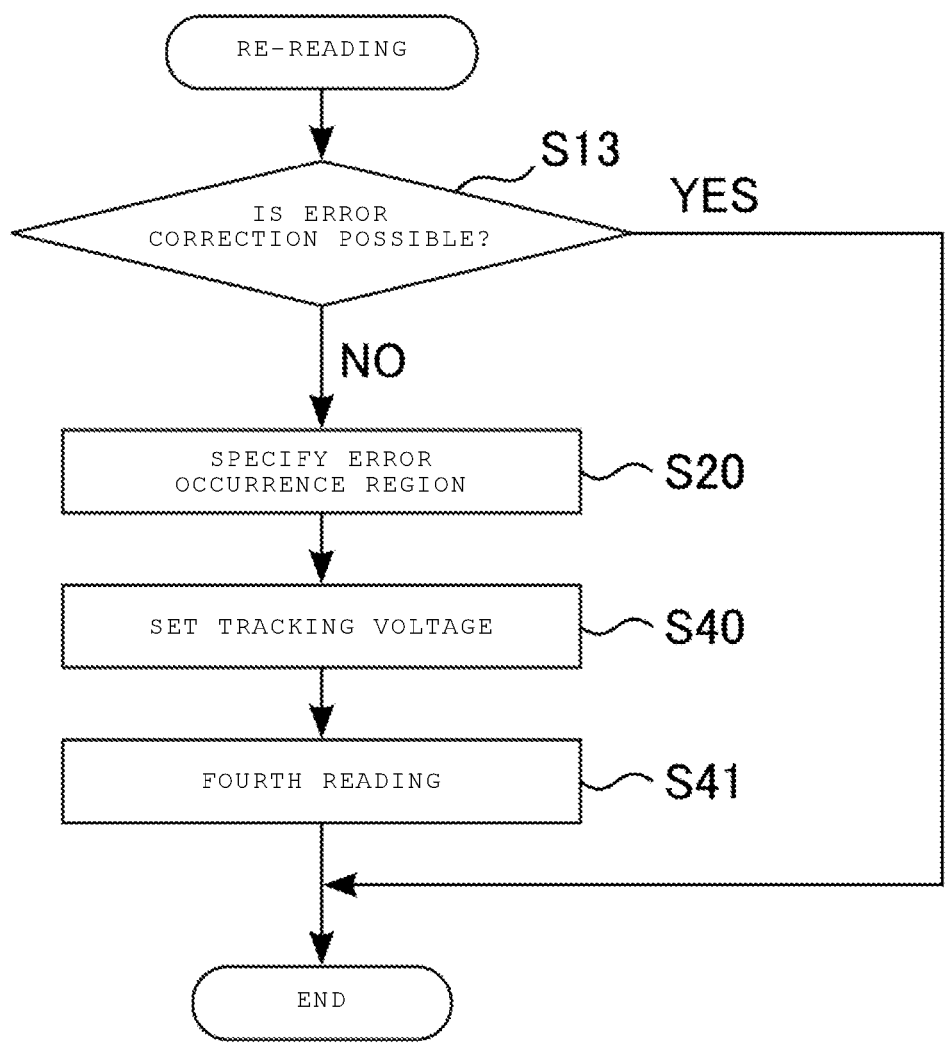
FIG. 25 is a flowchart illustrating an example of a read operation in a memory system according to a fourth embodiment.

FIG. 25 is a flowchart illustrating an example of a read operation of the memory system 1 according to the fourth embodiment, and illustrates an example of an operation subsequent to, for example, the re-reading in step S12 described with reference to FIG. 12 in the first embodiment.

As illustrated in FIG. 25, in a case where error correction of the read data is possible in the re-reading (YES in step S13), the memory system 1 transmits the corrected read data to the host apparatus 30, and finishes the read operation on the page.

On the other hand, in a case where error correction of the read data is not possible (NO in step S13), for example, the CPU 22 of the memory controller 20 extracts the column address CA at which an error occurs in the page based on an error correction result in the ECC circuit 25.

The memory controller 20 instructs the semiconductor memory 10 to perform fourth reading by using a command set including the column address CA at which the error occurs and voltage shift information. The voltage shift information is a parameter used in a case where a read operation is performed by using a voltage which is different from a typical read voltage.

If the semiconductor memory 10 receives the command set forgiving an instruction for the fourth reading, for example, the sequencer 14 specifies the region RG in which the error occurs based on the column address CA in the command set (step S20).

The sequencer 14 sets a tracking voltage used for division tracking read based on, for example, the voltage shift information (step S40). The set tracking voltage is set as a voltage higher than, for example, a typical tracking voltage.

An increase in width of the tracking voltage may be set based on, for example, a capacity of data on which error correction is not possible in the region RG in which an error occurs, may be set based on the selected region RG, and different increases in widths may be set for the respective selected regions RG. The tracking voltage set in step S40 may be a voltage lower than a typical tracking voltage.

The sequencer 14 performs fourth reading based on the specified region RG and the set tracking voltage (step S41). The fourth reading corresponds to an operation of changing a tracking voltage in division tracking read in the second reading described in the second embodiment.

Figure 26:
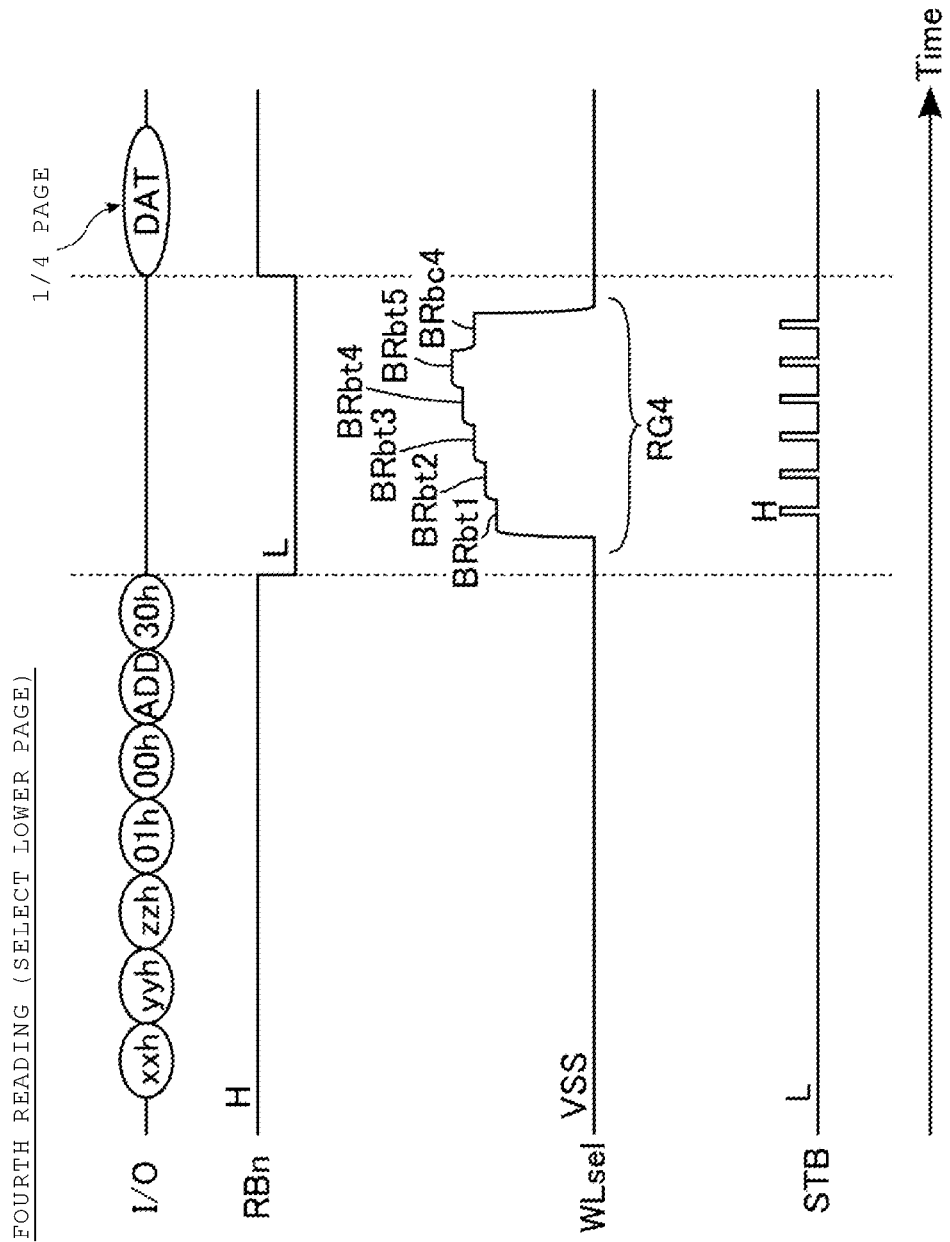
FIG. 26 is a timing chart illustrating examples of commands, and signals and voltages of respective lines during reading in the memory system according to the fourth embodiment.

Hereinafter, with reference to FIG. 26, a description will be made of an example of fourth reading in the memory system 1 according to the fourth embodiment. FIG. 26 illustrates commands and addresses which are input to the semiconductor memory 10, the ready/busy signal RBn, a voltage of the selected word line WLsel, and the control signal STB.

First, as illustrated in FIG. 26, the memory controller 20 sequentially transmits, for example, a command "xxh", a command "yyh", a command "zzh", a command "01h", a command "00h", the address information ADD, and a command "30h" to the semiconductor memory 10.

The command "zzh" is a command for designating a tracking voltage used for division tracking read, and corresponds to the above-described voltage shift information. In a case where the command "30h" is received, the semiconductor memory 10 transitions from a ready state to a busy state, and the sequencer 14 performs fourth reading.

For example, in a case where the region RG specified in step S20 is the region RG4, the sequencer 14 performs division tracking read in the group of the region RG4.

In this example, in division tracking read on the group of the region RG4, first, the sequencer 14 sets "0" in the latch circuit SDL of the sense amplifier unit SAU corresponding to the group of the region RG4, and sets "1" in the latch circuit SDL of the sense amplifier unit SAU corresponding to any group of the regions RG1, RG2, and RG3.

Next, a read operation using tracking voltages BRbt1, BRbt2, BRbt3, BRbt4, and BRbt5 is performed. For example, the tracking voltages BRbt1 to BRbt5 are respectively voltages higher than the tracking voltages BRt1 to BRt5. An optimal read voltage BRbc4 in the group of the region RG4 is estimated based on reading results.

A read operation using the read voltage BRbc4 is performed, and the sense amplifier unit SAU corresponding to the group of the region RG4 stores the reading result in the latch circuit SDL, and then transmits the reading result to the latch circuit ADL. In the fourth reading in this example, the reading result using the optimal read voltage BRbc4 is used as a reading result in the memory cell transistor MT corresponding to the group of the region RG4.

If it is detected that the division tracking read in the group of the designated region RG is finished, the sequencer 14 causes the semiconductor memory 10 to transition from a busy state to a ready state. Thereafter, the semiconductor memory 10 outputs a reading result in the group corresponding to the selected region RG to the memory controller 20 under the control of the memory controller 20. In this case, the data which is output from the semiconductor memory 10 to the memory controller 20 corresponds to, for example, ¼ pages. As mentioned above, a capacity of data which is output in the fourth reading is changed based on the number of selected regions RG.

In a case where error re-correction is not possible in the fourth reading, the memory system 1 according to the fourth embodiment may set a tracking voltage to be higher, and may perform the fourth reading again. Other detailed operations in the fourth reading are the same as that in the second reading described in the second embodiment, and thus description thereof will be omitted.

4-2. Effect of Fourth Embodiment

In a case where a defect occurs in the middle of the word line WL, as described with reference to FIG. 20 in the second embodiment, a resistance value of the word line WL may considerably change with a defect occurrence location as a boundary.

In this case, even if the memory system 1 performs division tracking read in the region RG in which a resistance value of the word line WL considerably increases, an effective voltage applied to the memory cell transistor MT connected to a portion of the word line WL corresponding to the region RG is lowered, and thus there is a possibility that a valley of threshold voltage distributions adjacent to each other cannot be detected.

Therefore, the memory system 1 according to the fourth embodiment performs, for example, the division tracking read described in the second embodiment by using a tracking voltage higher than in typical tracking read. In other words, the memory system 1 according to the fourth embodiment changes a tracking voltage applied to a portion where a resistance value of the word line WL changes, to a voltage with which a valley of threshold voltage distributions adjacent to each other can be appropriately determined.

Consequently, the memory system 1 according to the fourth embodiment can estimate an optimal read voltage even in a state in which an optimal read voltage cannot be estimated with a typical tracking voltage. Therefore, the memory system 1 according to the fourth embodiment can prevent a reduction in an amount of data which can be read, and can thus improve data reading capability.

In the fourth embodiment, as an example, a description was made of a case where the region RG on which error correction fails is selected, and division tracking read is performed, but this is only an example. For example, in the same manner as in the first reading described in the first embodiment, division tracking read to which a changed tracking voltage is applied may be performed on all regions RG.

The operation of the fourth reading described in the fourth embodiment may be applied to the first reading. For example, the memory controller 20 adds a command "zzh" to a command sequence for instructing the semiconductor memory 10 to perform the first reading. In this case, the semiconductor memory 10 performs the first reading using a tracking voltage which is changed based on the command "zzh". As mentioned above, the fourth reading may be combined with the read operations described in the other embodiments.

5. Fifth Embodiment

A configuration of the memory system 1 according to a fifth embodiment is the same as the configuration of the memory system 1 according to the first embodiment. In the memory system 1 according to the fifth embodiment, for example, the first reading is performed in search reading performed in an idle state. Hereinafter, the memory system 1 according to the fifth embodiment will be described focusing on differences from the first to fourth embodiments.

5-1. Operation

The memory system 1 performs, for example, search reading in an idle state. In the search reading, the memory system 1 sequentially performs a read operation on each page of each block BLK included in the memory cell array 11, and checks whether or not data reading is possible. For example, in a case where the number of error bits exceeds a predetermined number in a certain page, the memory system 1 evacuates data stored in the block BLK including the page to another block BLK, and registers the block BLK as a bad block.

A condition in which the block BLK is registered as a bad block is not limited thereto, and other conditions may be set. In the search reading, each of an order of blocks BLK on which a read operation is performed and an order of pages on which a read operation is performed in the selected block BLK may be set to any order.

Figure 27:
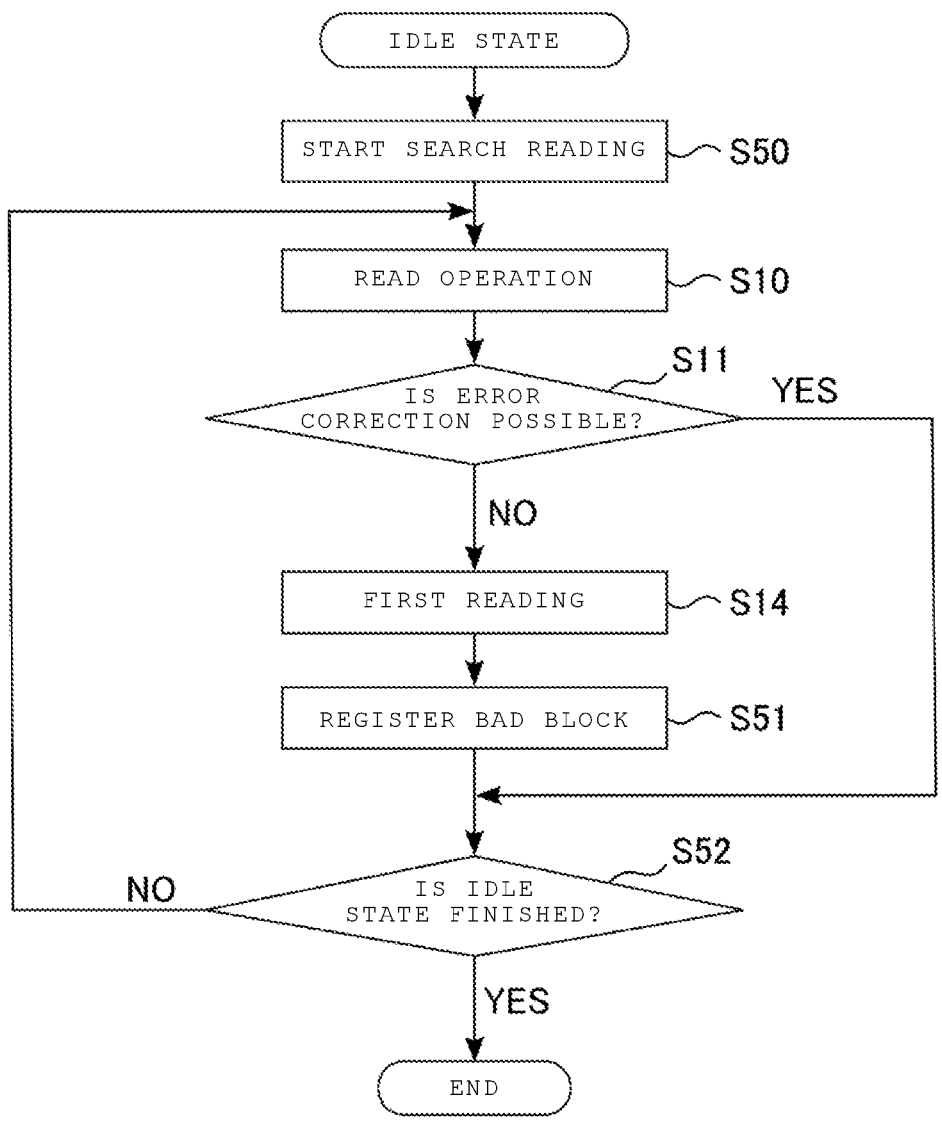
FIG. 27 is a flowchart illustrating an example of search reading in a memory system according to a fifth embodiment.

FIG. 27 is a flowchart illustrating an example of the search reading in the memory system 1 according to the fifth embodiment. Hereinafter, with reference to FIG. 27, a description will be made of a detailed operation in the search reading in the memory system 1 according to the fifth embodiment.

In the fifth embodiment, the memory system 1 starts the search reading in an idle state (step S50).

In the search reading, for example, the memory controller 20 instructs the semiconductor memory 10 to perform a read operation of selecting a certain page of the block BLK, and the semiconductor memory 10 performs a read operation of selecting the page (step S10).

In a case where error correction of data read from the semiconductor memory 10 in step S10 is possible (YES in step S11), the memory controller 20 checks whether or not the idle state of the memory system 1 is finished (step S52). In a case where the idle state is not finished, a process in the memory controller 20 returns to step S10, and instructs the semiconductor memory 10 to perform a read operation of selecting the next page.

In a case where error correction of data read from the semiconductor memory 10 in step S10 is not possible (NO in step S11), for example, the memory controller 20 instructs the semiconductor memory 10 to perform first reading on the page, and the semiconductor memory 10 performs the first reading.

The memory controller 20 performs error correction on the read data which is output from the semiconductor memory 10, and instructs the semiconductor memory 10 to write corrected read data into another block BLK. The memory controller 20 evacuates other data in the block BLK on which the semiconductor memory 10 performs the first reading to another block BLK in the same manner, and registers the block BLK in which an error occurs as a bad block (step S51).

Thereafter, the memory controller 20 checks whether or not the idle state of the memory system 1 is finished (step S52). In a case where the idle state is not finished, a process in the memory controller 20 returns to step S10, and instructs the semiconductor memory 10 to perform a read operation of selecting the next block BLK.

The above-described operations are repeatedly performed in a period in which the memory system 1 is in the idle state. If it is detected that the idle state is finished in step S52, the memory controller 20 finishes the search reading.

5-2. Effect of Fifth Embodiment

As mentioned above, the memory system 1 according to the fifth embodiment uses the first reading used in the first embodiment during the search reading in an idle state. Consequently, the memory system 1 according to the fifth embodiment can also improve data reading capability for the block BLK in which a defect occurs in the search reading in the same manner as in the first embodiment.

Any frequency of the memory system 1 performing the search reading may be set. The memory system 1 may perform the search reading when an idle state occurs. Alternatively, the search reading may be performed when the number of being brought into an idle state reaches a predetermined number. For example, the search reading may be performed when an idle state initially occurs after a predetermined period (a day, a week, or a month) elapses.

In the fifth embodiment, as an example, a description was made of a case where the first reading is performed after a typical read operation, but this is only an example. For example, instead of step S14 illustrated in FIG. 27, the second reading, the third reading, and the fourth reading described in the second to fourth embodiments may be performed.

In a case where error correction is not successful in the division tracking read in step S14, any of the second reading, the third reading, and the fourth reading may be continuously performed. Also in this case, the memory system 1 according to the fifth embodiment can achieve the same effect as that of any of the second to fourth embodiments.

6. Sixth Embodiment

A configuration of the memory system 1 according to a sixth embodiment is the same as the configuration of the memory system 1 according to the first embodiment. The memory system 1 according to the sixth embodiment performs a read operation of examining a state of the selected cell unit CU by using the division tracking read described in the first embodiment or the like. Hereinafter, the memory system 1 according to the sixth embodiment will be described focusing on differences from the first to fifth embodiments.

6-1. Operation

The memory system 1 according to the sixth embodiment performs a state checking operation using fifth reading in a case where a state of the cell unit CU is examined. The fifth reading corresponds to an operation of performing the division tracking read described in the first embodiment on the regions RG at both ends.

Figure 28:
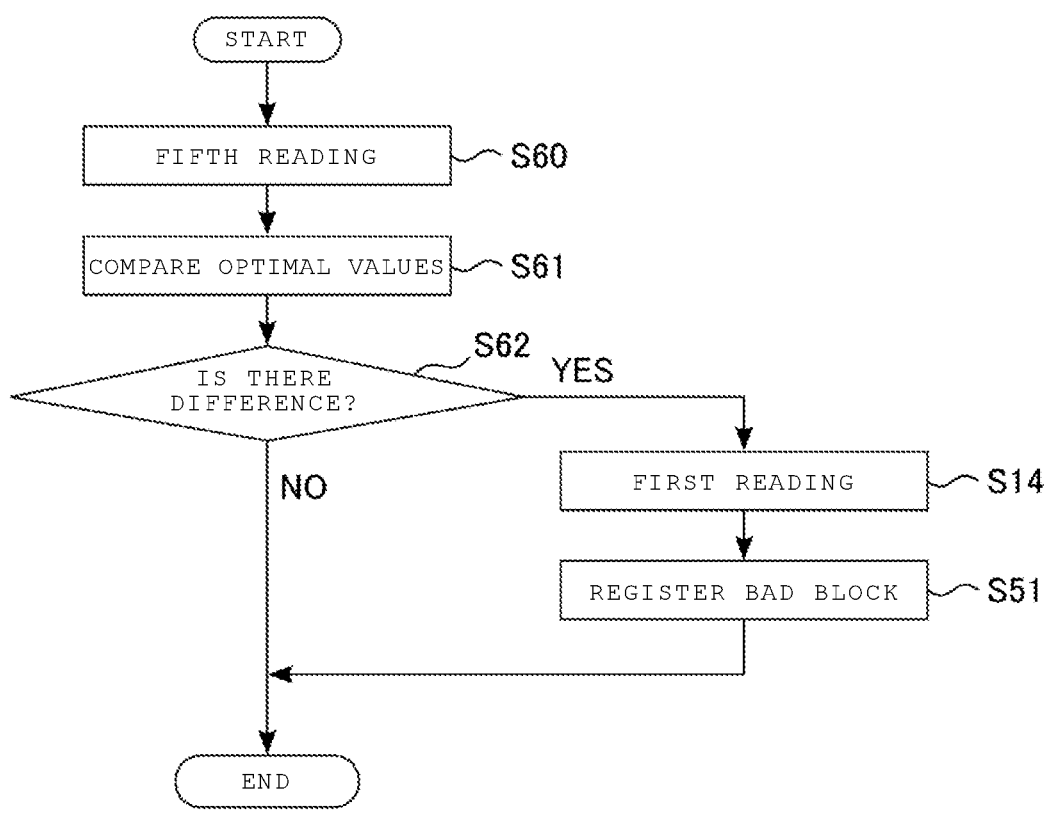
FIG. 28 is a flowchart illustrating an example of a state checking operation of a memory system according to a sixth embodiment.

Hereinafter, with reference to FIG. 28, a description will be made of a state checking operation of the memory system 1 according to the sixth embodiment. FIG. 28 is a flowchart illustrating an example of a state checking operation of the memory system 1 according to the sixth embodiment.

In the state checking operation, the memory system 1 selects the cell unit CU of which a state is desired to be examined, and performs the fifth reading. Specifically, for example, the memory controller 20 instructs the semiconductor memory 10 to perform the fifth reading of a certain page of any block BLK, and the semiconductor memory 10 performs the fifth reading of the page (step S60).

In the fifth reading, the memory controller 20 instructs the semiconductor memory 10 to perform division tracking read on the regions RG corresponding to both ends. FIG. 29 illustrates examples of the regions RG selected in the fifth reading.

As illustrated in FIG. 29, in a case where the fifth reading is performed, for example, both of the region RG1 closest to the contact plug CC and the region RG4 farthest from the contact plug CC are selected. In other words, in the fifth reading, the memory controller 20 instructs the semiconductor memory 10 to perform division tracking read of selecting, for example, the regions RG1 and RG4. A detailed operation in the division tracking read is the same as the division tracking read described in the second embodiment, and output information differs.

Specifically, in the fifth reading, the semiconductor memory 10 outputs, to the memory controller 20, information for determining whether or not there is a difference between an optimal read voltage estimated in the region RG1 and the optimal read voltage estimated in the region RG4 under the control of the memory controller 20. For example, a parameter corresponding to an optimal read voltage in each of the regions RG corresponding to both ends is used as the information.

The memory controller 20 determines whether or not there is a difference between the optimal read voltages in the respective regions RG corresponding to both ends based on the information output from the semiconductor memory 10 through the fifth reading (step S61).

In a case where there is no difference between the optimal read voltages in the respective regions RG corresponding to both ends (NO in step S62), the memory controller 20 regards a state of the selected cell unit CU to be favorable, finishes the state checking operation, and performs a normal read operation thereafter.

In a case where there is a difference between the optimal read voltages in the respective regions RG corresponding to both ends (YES in step S62), the memory controller 20 sequentially performs the processes in steps S14 and S51 described with reference to FIG. 27 in the fifth embodiment.

For example, by using the first reading, the memory controller 20 evacuates data of the block BLK on which the fifth reading is previously performed to another block BLK, and registers the block BLK on which the fifth reading is previously performed as a bad block.

If the processes in steps S14 and S51 are finished, the memory controller 20 finishes the state checking operation.

6-2. Effect of Sixth Embodiment

As mentioned above, the memory system 1 according to the sixth embodiment performs division tracking read (fifth reading) of selecting the regions RG corresponding to both ends in the state checking operation. The memory controller 20 estimates whether or not a defect occurs in the word line WL (cell unit CU) corresponding to a page on which the fifth reading is performed based on a result of the fifth reading.

For example, it is considered that, in a case where a defect does not occur in the word line WL in the regions RG corresponding to both ends, optimal read voltages estimated through the division tracking read are the same as each other, and, in a case where a defect occurs in the word line WL, optimal read voltages estimated through the division tracking read are different from each other.

As mentioned above, the memory system 1 according to the sixth embodiment can check the occurrence of a defect in the unit of the cell unit CU by performing the fifth reading. In a case where it is detected that a defect occurs in the word line WL, the memory system 1 according to the sixth embodiment performs the first reading described in the first embodiment, and can thus improve data reading capability in the same manner as in the first embodiment.

The above-described state checking operation may be performed by the memory controller 20 at any timing, and is performed, for example, during the search reading described in the fifth embodiment. The state checking operation (fifth reading) may be performed, for example, after an erasing operation or after a write operation.

In a case where the fifth reading is performed after an erasing operation, the memory system 1 may examine a variation in a threshold voltage of the memory cell transistor MT brought into an erasing state. In this case, the memory system 1 may set the irregular block BLK, that is, the block BLK in which characteristics of the memory cell transistor MT deteriorate as a bad block. The memory system 1 may examine a state of the memory cell transistor MT after a write operation in the same manner for a case where the fifth reading is performed after the write operation, and may set a bad block as appropriate.

In the sixth embodiment, as an example, a description was made of a case where, in the state checking operation, the first reading is performed after the fifth reading, but this is only an example. For example, instead of step S14 illustrated in FIG. 28, the second reading, the third reading, and the fourth reading described in the second to fourth embodiments may be performed.

In a case where error correction is not successful in the division tracking read in step S14, any of the second reading, the third reading, and the fourth reading may be continuously performed. Also in this case, the memory system 1 according to the sixth embodiment can achieve the same effect as that of any of the second to fourth embodiments.

In the sixth embodiment, as an example, a description was made of a case where the state checking operation is finished if no difference is detected in step S62, but this is only an example. For example, even in a case where no difference is detected in step S62, the memory system 1 may recheck the presence or absence of an error by performing a typical read operation of selecting the cell unit CU.

7. Modification Examples and the Like

A memory system (for example, the reference numeral 1 in FIG. 1) includes a semiconductor memory (the reference numeral 10 in FIG. 1) and a memory controller (for example, the reference numeral 20 in FIG. 1). The semiconductor memory includes a plurality of first and second memory cells, a plurality of first and second bit lines, a word line, and a driver. The memory controller controls the semiconductor memory. Each of the plurality of first and second memory cells stores data based on a threshold voltage. The plurality of first bit lines are connected to the plurality of first memory cells. The plurality of second bit lines are connected to the plurality of second memory cells. The word line is connected to each of the plurality of first and second memory cells. The driver applies a voltage to the word line. In a case where the memory controller transmits a command set including a first command (for example, the reference sign xxh in FIG. 13) for instructing a first operation (for example, the fifth reading in FIG. 13) to be performed and a second command (for example, the reference sign 00h in FIG. 13) for instructing a read operation to be performed, to the semiconductor memory, the semiconductor memory performs the first operation. In the first operation, the driver sequentially applies a plurality of types of first read voltages (for example, the reference signs BRt1 to BRt5 (RG1) in FIG. 13), one (for example, the reference sign BRc1 in FIG. 13) of the plurality of types of first read voltages, a plurality of types of second read voltages (for example, the reference signs BRt1 to BRt5 (RG2) in FIG. 13), one (for example, the reference sign BRc2 in FIG. 13) of the plurality of types of second read voltages, to the word line. Consequently, the memory system can improve the capability of reading data stored in the memory cell.

In the first to fourth embodiments, as an example, a description was made of a case where any of the first reading to the fourth reading is performed after re-reading, but this is only an example. For example, any of the first reading to the fourth reading may be performed as re-reading after a typical read operation. In a case where information regarding a page in which an error occurs is specified, the memory system 1 may perform any of the first reading to the fourth reading from the beginning.

The memory system 1 may use a combination of the first reading to the fourth reading described in the first to fourth embodiments. For example, the memory system 1 may perform the third reading as re-reading after the first reading is performed, and may perform the fourth reading as re-reading after the first reading is performed.

In the embodiments, as an example, a description was made of a case where a parameter is changed based on a command from the memory controller 20, but this is only an example. For example, the memory controller 20 may perform an operation of changing settings of the semiconductor memory 10 side in order to change a tracking voltage in the fourth reading.

FIG. 30 illustrates an example of a command sequence related to an operation of changing settings. As illustrated in FIG. 30, first, the memory controller 20 issues a setting changing command "zxh", and transmits the command to the semiconductor memory 10. The command "zxh" is a command for instructing the semiconductor memory 10 to change a parameter.

Next, the memory controller 20 issues the address information ADD, and transmits the address information ADD to the semiconductor memory 10. The address information ADD is information for designating an address corresponding to a parameter which is desired to be changed. Next, the memory controller 20 outputs, for example, set data DAT over a plurality of cycles to the semiconductor memory 10. The set data DAT is data corresponding to a parameter to be changed. In a case where the commands and the like are received, the semiconductor memory 10 transitions to a busy state, and the sequencer 14 starts a setting changing operation. In a case where the set parameter is rewritten based on the received address and data, the sequencer 14 causes the semiconductor memory 10 to transition to a ready state. If the setting changing operation is finished, for example, changed settings are applied to a tracking voltage in the fourth reading in the semiconductor memory 10.

In the embodiments, each of the command "xxh", the command "yyh", and the command "zzh" used for description may be replaced with any command. In the embodiments, as an example, a description was made of a case where the commands "01h" and "02h" are used as a command for giving an instruction for an operation corresponding to a lower page or an upper page, but this is only an example. For example, the commands may be replaced with other commands, and the commands may be omitted by causing information regarding a page to be included in the address information ADD.

In the embodiments, as an example, a description was made of a case where reading is performed in the page unit, but this is only an example. For example, the memory system 1 may sequentially read data of a plurality of pages stored in a single cell unit CU. The memory system 1 may perform sequential tracking read on a plurality of pages in tracking read. The operation described in the embodiments may be applied to such an operation.

In the embodiments, as an example, a description was made of a case where a single memory cell transistor MT stores 2-bit data, but this is only an example. 1-bit data may be stored in each memory cell transistor MT in the cell unit CU, and data of 3 bits or more may be stored. Also in this case, the memory system 1 can perform the operation described in the embodiments by changing a read voltage or a tracking voltage as appropriate, and can thus achieve the same effect.

In the first reading of an upper page described in the first embodiment, as an example, a description was made of a case where the semiconductor memory 10 performs reading using the tracking voltages ARt1 to ARt5 and CRt1 to CRt5, and then performs reading using the optimal read voltages ARc1 and CRc1, but this is only an example. For example, the semiconductor memory 10 may perform reading using the tracking voltages ARt1 to ARt5, then perform reading using the optimal read voltage ARc1, and perform reading using the tracking voltages CRt1 to CRt5, and then perform reading using the optimal read voltage CRc1. This is also the same for tracking read of selecting other regions RG.

In each of a write operation and a read operation in the embodiments, a voltage applied to the selected word line WLsel is the same as, for example, a voltage of the signal line CG through which a voltage is applied to the row decoder module 16 from the driver circuit 15. In other words, voltages applied to various interconnections or a period in which a voltage is applied can be roughly understood by examining a voltage of the corresponding signal line CG.

In a case where voltages of a select gate line and a word line are estimated based on a voltage of each signal line connected to the driver circuit 15, a voltage drop in the transistor TR in the row decoder RD may be taken into consideration. In this case, a voltage of each of the select gate line and the word line is lower than a voltage applied to each corresponding signal line by the voltage drop in the transistor TR.

In the present specification, "connection" indicates electrical connection, and does not exclude a case where a separate element is interposed between elements. In the present specification, an "OFF state" indicates that a voltage lower than a threshold voltage of a transistor is applied to a gate of the corresponding transistor, and does not exclude a case where a minute current such as a leakage current of a transistor flows.

The memory cell array 11 in the embodiments may have other configurations. Other configurations of the memory cell array 11 are disclosed in, for example, U.S. patent application Ser. No. 12/407,403, filed on Mar. 19, 2009, entitled "three-dimensional stacked nonvolatile semiconductor memory", U.S. patent application Ser. No. 12/406,524, filed on Mar. 18, 2009, entitled "three-dimensional stacked nonvolatile semiconductor memory", U.S. patent application Ser. No. 12/679,991, filed on Mar. 25, 2010, entitled "nonvolatile semiconductor memory device and manufacturing the same", and U.S. patent application Ser. No. 12/532,030, filed on Mar. 23, 2009, entitled "semiconductor memory and manufacturing same". The entire contents of these patent applications are incorporated by reference in the present application.

In the embodiments, the block BLK may not be the erasing unit. Other erasing operations are disclosed in U.S. patent application Ser. No. 13/235,389, filed on Sep. 18, 2011, entitled "nonvolatile semiconductor memory device" and U.S. patent application Ser. No. 12/694,690, filed on Jan. 27, 2010, entitled "nonvolatile semiconductor memory device". The entire contents of these patent applications are incorporated by reference in the present application.

In the embodiments, in a write operation, a voltage initially applied to a selected word line in a case where an odd-numbered word line is selected may be different from a voltage initially applied to a selected word line in a case where an even-numbered word line is selected. In a write operation, a pass voltage to be applied to a non-selected word line may be changed depending on whether the non-selected word line is an odd-numbered word line or an even-numbered word line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a plurality of first memory cells each storing data based on a threshold voltage;
    a plurality of first bit lines connected to the plurality of first memory cells;
    a plurality of second memory cells each storing data based on a threshold voltage;
    a plurality of second bit lines connected to the plurality of second memory cells;
    a word line connected to the plurality of first and second memory cells; and
    a driver configured to apply a voltage to the word line,
    wherein, upon receipt of a command set including a first command for instructing a first operation to be performed and a second command for instructing a read operation to be performed, the driver sequentially applies, to the word line:
        a plurality of first read voltages to read data from the first memory cells,
        a second read voltage within a voltage range of the first read voltages to read data from the first memory cells,
        a plurality of third read voltages to read data from the second memory cells, and
        a fourth read voltage within a voltage range of the third read voltages to read data from the second memory cells.

2. The memory device according to claim 1, wherein the first read voltages have same voltage levels as the third read voltages.

3. The memory device according to claim 1, wherein a voltage level of one of the first read voltages is different from a voltage level of one of the third read voltages.

4. The memory device according to claim 1, further comprising:
    a contact plug that electrically connects the word line to the driver, and is provided on the word line,
    wherein a distance between one of the first memory cells farthest from the contact plug among the plurality of first memory cells and the contact plug is shorter than a distance between one of the second memory cells closest to the contact plug among the plurality of second memory cells and the contact plug.

5. The memory device according to claim 1, further comprising:
    a plurality of first sense amplifiers connected to the first bit lines, respectively;
    a plurality of first latch circuits connected to the first sense amplifiers, respectively, and configured to store data read from the first memory cells, respectively;
    a plurality of second sense amplifiers connected to the second bit lines, respectively; and a plurality of second latch circuits connected to the second sense amplifiers, respectively, and configured to store data read from the second memory cells, respectively, wherein, after the read operation has been performed in response to the command set, first data which are read from the first memory cells using the second read voltage are output from the first latch circuits to outside of the memory device, and second data which are read from the second memory cells using the fourth read voltage are output from the second latch circuits to the outside of the memory device.

6. The memory device according to claim 5,
wherein each of the first data and the second data includes data of a plurality of bits and a parity corresponding to the data of the plurality of bits.

7. The memory device according to claim 1,
wherein the first read voltages are applied by the driver as part of a tracking read operation on the first memory cells, and the third read voltages are applied by the driver as part of a tracking read operation on the second memory cells.

8. The memory device according to claim 7,
wherein the second read voltage is estimated from the first read voltages and results from the tracking read operation on the first memory cells, and the fourth read voltage is estimated from the third read voltages and results from the tracking read operation on the second memory cells.

9. The memory device according to claim 8,
wherein the second read voltage is one of the first read voltages, and the fourth read voltage is one of the third read voltages.

10. A method for controlling a memory device,
the memory device comprising:
  a plurality of first memory cells each storing data based on a threshold voltage;
  a plurality of first bit lines connected to the plurality of first memory cells;
  a plurality of second memory cells each storing data based on a threshold voltage;
  a plurality of second bit lines connected to the plurality of second memory cells;
  a word line connected to the plurality of first and second memory cells; and
  a driver configured to apply a voltage to the word line,
the method comprising:
  upon receipt of a command set including a first command for instructing a first operation to be performed and a second command for instructing a read operation to be performed, causing the driver to sequentially apply, to the word line:
    a plurality of first read voltages to read data from the first memory cells,
    a second read voltage within a voltage range of the first read voltages to read data from the first memory cells,
    a plurality of third read voltages to read data from the second memory cells, and
    a fourth read voltage within a voltage range of the third read voltages to read data from the second memory cells.

11. The method according to claim 10,
wherein the first read voltages have same voltage levels as the third read voltages.

12. The method according to claim 10,
wherein a voltage level of one of the first read voltages is different from a voltage level of one of the third read voltages.

13. The method according to claim 10, further comprising:
  after the read operation has been performed:
    outputting first data which are read from the first memory cells using the second read voltage to outside of the memory device, and
    outputting second data which are read from the second memory cells using the fourth read voltage to the outside of the memory device.

14. The method according to claim 13,
wherein each of the first data and the second data includes data of a plurality of bits and a parity corresponding to the data of the plurality of bits.

15. The method according to claim 10,
wherein the first read voltages are applied by the driver as part of a tracking read operation on the first memory cells, and the third read voltages are applied by the driver as part of a tracking read operation on the second memory cells.

16. The method according to claim 15,
wherein the second read voltage is estimated from the first read voltages and results from the tracking read operation on the first memory cells, and the fourth read voltage is estimated from the third read voltages and results from the tracking read operation on the second memory cells.

17. The method according to claim 16,
wherein the second read voltage is one of the first read voltages, and the fourth read voltage is one of the third read voltages.

18. A memory system comprising:
  a semiconductor memory that includes:
    a plurality of first memory cells each storing data based on a threshold voltage,
    a plurality of first bit lines connected to the plurality of first memory cells,
    a plurality of second memory cells each storing data based on a threshold voltage,
    a plurality of second bit lines connected to the plurality of second memory cells,
    a word line connected to the plurality of first and second memory cells, and
    a driver configured to apply a voltage to the word line; and
  a memory controller that includes:
    a processor configured to control the semiconductor memory, and
    a first circuit configured to perform error correction of read data output from the semiconductor memory, wherein:
  in response to a first command set sent from the memory controller, the driver in the semiconductor memory sequentially applies, to the word line,
    a plurality of first read voltages to read data from the first memory cells,
    a second read voltage within a voltage range of the first read voltages to read data from the first memory cells,
    a plurality of third read voltages to read data from the second memory cells, and
    a fourth read voltage within a voltage range of the third read voltages to read data from the second memory cells;

first data which are read from the first memory cells using the second read voltage and second data which are read from the second memory cells using the fourth read voltage are output to the memory controller;

in response to the first data and the second data output from the semiconductor memory,
the first circuit performs the error correction on the first data and on the second data, and
the memory controller sends a second command set to the semiconductor memory;

in response to the second command set sent from the memory controller, the driver in the semiconductor memory sequentially applies, to the word line,
a plurality of fifth read voltages to read data from either one of the first memory cells or the second memory cells, and
a sixth read voltage within a voltage range of the fifth read voltages to read data from the either one of the first memory cells or the second memory cells; and third data which are read from the either one of the first memory cells or the second memory cells are output to the memory controller.

19. The memory system according to claim 18, wherein the first read voltages have same voltage levels as the third read voltages.

20. The memory system according to claim 18, wherein a voltage level of one of the first read voltages is different from a voltage level of one of the third read voltages.

\* \* \* \* \*